(12) United States Patent
Isa et al.

(10) Patent No.: US 8,598,586 B2
(45) Date of Patent: Dec. 3, 2013

(54) THIN FILM TRANSISTOR AND MANUFACTURING METHOD THEREOF

(75) Inventors: Toshiyuki Isa, Kanagawa (JP); Atsushi Hirose, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 283 days.

(21) Appl. No.: 12/970,460

(22) Filed: Dec. 16, 2010

(65) Prior Publication Data
US 2011/0147754 A1    Jun. 23, 2011

(30) Foreign Application Priority Data
Dec. 21, 2009 (JP) ................................ 2009-289868

(51) Int. Cl.
*H01L 29/04* (2006.01)
(52) U.S. Cl.
USPC ..................................... 257/60; 257/E33.004
(58) Field of Classification Search
USPC .............. 438/149–167; 257/59, 66, E33.004, 257/E29.294
See application file for complete search history.

(56) References Cited

U.S. PATENT DOCUMENTS

| | | | |
|---|---|---|---|
| 4,409,134 A | 10/1983 | Yamazaki | |
| 5,453,858 A | 9/1995 | Yamazaki | |
| 5,514,879 A | 5/1996 | Yamazaki | |
| 5,614,732 A | 3/1997 | Yamazaki | |
| 5,701,167 A | 12/1997 | Yamazaki | |
| 5,849,601 A | 12/1998 | Yamazaki | |
| 5,859,445 A | 1/1999 | Yamazaki | |
| 6,011,277 A | 1/2000 | Yamazaki | |
| 6,023,075 A | 2/2000 | Yamazaki | |
| 6,252,249 B1 | 6/2001 | Yamazaki | |
| 6,281,520 B1 | 8/2001 | Yamazaki | |
| 6,306,213 B1 | 10/2001 | Yamazaki | |
| 6,737,676 B2 | 5/2004 | Yamazaki | |
| 7,067,844 B2 | 6/2006 | Yamazaki | |

(Continued)

FOREIGN PATENT DOCUMENTS

| | | |
|---|---|---|
| EP | 0 535 979 A2 | 4/1993 |
| JP | 02-053941 | 11/1990 |

(Continued)

OTHER PUBLICATIONS

Arai, et al., "41.2: Micro Silicon Technology for Active Matrix OLED Display", Sid 07 Digest, Sid international Symposium Digest of Technical Papers, 2007, vol. 38, pp. 1370-1373.

(Continued)

*Primary Examiner* — Brook Kebede
(74) *Attorney, Agent, or Firm* — Nixon Peabody LLP; Jeffrey L. Costellia

(57) ABSTRACT

Disclosed is a thin film transistor including: a gate insulating layer covering a gate electrode; a microcrystalline semiconductor region over the gate insulating layer; a pair of amorphous semiconductor region over the microcrystalline semiconductor; a pair of impurity semiconductor layers over the amorphous semiconductor regions; and wirings over the impurity semiconductor layers. The microcrystalline semiconductor region has a surface having a projection and depression on the gate insulating layer side. The microcrystalline semiconductor region includes a first microcrystalline semiconductor region which is not covered with the amorphous regions and a second microcrystalline semiconductor region which is in contact with the amorphous semiconductor regions. A thickness d1 of the first microcrystalline semiconductor region is smaller than a thickness d2 of the second microcrystalline semiconductor region and d1 is greater than or equal to 30 nm.

15 Claims, 17 Drawing Sheets

(56) References Cited

U.S. PATENT DOCUMENTS

| | | |
|---|---|---|
| 7,098,479 B1 | 8/2006 | Yamazaki |
| 7,115,902 B1 | 10/2006 | Yamazaki |
| 7,432,906 B2 | 10/2008 | Nakajima et al. |
| 7,511,709 B2 | 3/2009 | Koyama et al. |
| 7,576,360 B2 | 8/2009 | Yamazaki |
| 2004/0221809 A1 | 11/2004 | Ohmi et al. |
| 2005/0012097 A1 | 1/2005 | Yamazaki |
| 2005/0012887 A1 | 1/2005 | Koyama et al. |
| 2005/0022864 A1 | 2/2005 | Fujioka et al. |
| 2007/0018165 A1 | 1/2007 | Yamazaki |
| 2008/0299689 A1 | 12/2008 | Yamazaki |
| 2009/0321743 A1* | 12/2009 | Isa et al. .......... 257/66 |
| 2010/0148177 A1* | 6/2010 | Koyama et al. ........ 257/59 |
| 2011/0121300 A1 | 5/2011 | Miyairi et al. |

FOREIGN PATENT DOCUMENTS

| | | |
|---|---|---|
| JP | 04-242724 | 8/1992 |
| JP | 05-129608 | 5/1993 |
| JP | 07-131030 | 5/1995 |
| JP | 11-121761 | 4/1999 |
| JP | 2000-277439 | 10/2000 |
| JP | 2001-053283 | 2/2001 |
| JP | 2001-217424 | 8/2001 |
| JP | 2004-014958 | 1/2004 |
| JP | 2005-049832 | 2/2005 |
| JP | 2005-167051 | 6/2005 |
| JP | 2005-191546 | 7/2005 |
| JP | 2010-109341 | 5/2010 |
| JP | 2010-123925 | 6/2010 |
| JP | 2010-123926 | 6/2010 |

OTHER PUBLICATIONS

Lee, et al., "How to Achieve High Mobility Thin Film Transistors by Direct Deposition of Silicon Using 13.56 MHz RF PECVD?", IEDM 06, Technical Digest of International Electron Device Meeting, Dec. 11, 2006, pp. 295-298.

Lee, et al., "Directly Deposited Nanocrystalline Silicon Thin-Film Transistors with Ultra High Mobilities", Appl. Phys. Lett. (Applied Physics Letters), Dec. 18, 2006, vol. 89, No. 25, pp. 252101-1-252101-3.

Lee, et al., "High-Mobility Nanocrystalline Silicon Thin-Film Transistors Fabricated by Plasma-Enhanced Chemical Vapor Deposition", Appl. Phys. Lett. (Applied Physics Letters), May 24, 2005, vol. 86, pp. 222106-1-222106-3.

Lee, et al., "High Mobility N-Channel and P-Channel Nanocrystalline Silicon Thin-Film Transistors", IEDM 05, Technical Digest of International Electron Devices Meeting, 2005, pp. 937-940.

Esmaeili-Rad, et al., "High Stability, Low Leakage Nanocrystalline Silicon Bottom Gate Thin Film Transistors for AMOLED Displays", IEDM 06, Technical Digest of International Electron Devices Meeting, 2006, pp. 303-306.

Lee, et al., "Leakage Current Mechanisms in Top-Gate Nanocrystalline Silicon Thin Film Transistors", Appl. Phys. Lett. (Applied Physics Letters), Feb. 28, 2008, vol. 92, pp. 083509-1-083509-3.

Esmaeili-Rad, et al., "Absence of Defect State Creation in Nanocrystalline Silicon Thin Film Transistors Deduced form Constant Current Stress Measurements", Appl. Phys. Lett. (Applied Physics Letters), Sep. 12, 2007, vol. 91, No. 11, pp. 113511-1-113511-3.

Lee, et al., "Stability of nc-Si:H TFTs With Silicon Nitride Gate Dielectric", IEEE Transactions on Electron Devices, Jan. 2007, vol. 54, No. 1, pp. 45-51.

Sazonov, et al. "Low-Temperature Materials and Thin Film Transistors for Flexible Electronics", Proceedings of the IEEE, Aug. 1, 2005, vol. 93, No. 8, pp. 1420-1428.

Esmaeili-Rad, et al., "Stability of Nanocrystalline Silicon Bottom-Gate Thin Film Transistors with Silicon Nitride Gate Dielectric", J. Appl. Phys. (Journal of Applied Physics), Sep. 28, 2007, vol. 102, No. 6, pp. 064512-1-064512-7.

Lee, et al., "Top-Gate TFTs Using 13.56 MHz PECVD Microcrystalline Silicon", IEEE Electron Device Letters, Sep. 5, 2005, vol. 26, No. 9, pp. 637-639.

Lee, et al., "Postdeposition Thermal Annealing and Material Stability of 75° C Hydrogenated Nanocrystalline Silicon Plasma-Enhanced Chemical Vapor Deposition Films", J. Appl. Phys. (Journal of Applied Physics), Aug. 4, 2005, vol. 98, No. 3, pp. 034305-1-034305-7.

Cho, et al., "Characteristics of a-Si:H Dual-Gate TFTs Using ITO Electrode for LCD Driver", AM-FPD 08 Digest of Technical Papers, Jul. 2, 2008, pp. 229-232.

* cited by examiner

THIN FILM TRANSISTOR AND MANUFACTURING METHOD THEREOF

BACKGROUND OF THE INVENTION

1. Field of the Invention

The present invention relates to a thin film transistor and a method for manufacturing the thin film transistor, and a display device to which the thin film transistor is applied.

2. Description of the Related Art

As a kind of field-effect transistor, a thin film transistor in which a channel formation region is formed in a semiconductor layer formed over a substrate having an insulating surface is known. Techniques in which amorphous silicon, microcrystalline silicon, or polycrystalline silicon is used for a semiconductor layer used in the thin film transistor have been disclosed (see Patent Documents 1 to 5). A typical application of thin film transistors is a liquid crystal display television device, in which thin film transistors have been put to practical use as a switching transistor for each pixel that constitutes a display screen.

REFERENCES

[Patent Document 1] Japanese Published Patent Application No. 2001-053283
[Patent Document 2] Japanese Published Patent Application No. H5-129608
[Patent Document 3] Japanese Published Patent Application No. 2005-049832
[Patent Document 4] Japanese Published Patent Application No. H7-131030
[Patent Document 5] Japanese Published Patent Application No. 2005-191546

SUMMARY OF THE INVENTION

A thin film transistor in which a channel is formed using an amorphous silicon layer has problems such as low field effect mobility and small on current. On the other hand, a thin film transistor in which a channel is formed using a microcrystalline silicon layer has a problem in that, whereas the field effect mobility is higher than that of the thin film transistor in which a channel is formed using an amorphous silicon layer, off current is large, and thus sufficient switching characteristics cannot be obtained.

A thin film transistor in which a polycrystalline silicon layer is used for a channel formation region has characteristics such as much higher field effect mobility and higher on current than the above-described two types of thin film transistors. Because of such characteristics, this thin film transistor can be used not only as a switching transistor provided in a pixel but also in a driver circuit for which high-speed operation is required.

However, formation of the thin film transistor in which a channel formation region is formed using a polycrystalline silicon layer requires a crystallization step for a semiconductor layer and has a problem of higher manufacturing cost, as compared to the thin film transistor in which an amorphous silicon layer functions a channel formation region. For example, a laser annealing technique involved in the process for forming a polycrystalline silicon layer has a problem in that large-screen liquid crystal panels cannot be produced efficiently because the laser beam irradiation area is small.

A glass substrate for manufacturing display panels has grown in size from year to year as follows: the third generation (550 mm×650 mm), the three-point-five generation (600 mm×720 mm or 620 mm×750 mm), the fourth generation (680 mm×880 mm or 730 mm×920 mm), the fifth generation (1100 mm×1300 mm), the sixth generation (1500 mm×1850 mm), the seventh generation (1870 mm×2200 mm), and the eighth generation (2200 mm×2400 mm). From now on, the size of the glass substrate is expected to grow to the ninth generation (2400 mm×2800 mm or 2450 mm×3050 mm) and the tenth generation (2950 mm×3400 mm). The increase in size of glass substrate is based on the concept of minimum cost design.

On the other hand, a technique with which a thin film transistor capable of high-speed operation can be manufactured with high productivity over a large-area mother glass substrate like that of the tenth generation (2950 mm×3400 mm) has not been established yet, which is a problem in industry.

Therefore, it is an object of an embodiment of the present invention to provide a method for manufacturing a thin film transistor which has excellent electric characteristics with high productivity.

An embodiment of the present invention is a thin film transistor including a gate insulating layer which covers a gate electrode, a semiconductor layer which is in contact with the gate insulating layer, an impurity semiconductor layer which is in contact with part of the semiconductor layer and forms source and drain regions, and a wiring which is in contact with the impurity semiconductor layer. The semiconductor layer includes: a microcrystalline semiconductor region which is formed on the gate insulating layer side and has a surface (an upper surface) having a projection and depression on the side of the impurity semiconductor layer; and amorphous semiconductor regions which are apart from each other and in contact with part of the microcrystalline semiconductor region. The microcrystalline region includes a first microcrystalline semiconductor region which is not covered with the amorphous semiconductor regions and a second microcrystalline semiconductor region which is in contact with the amorphous semiconductor regions. A thickness d1 of the first microcrystalline semiconductor region is smaller than a thickness d2 of the second microcrystalline semiconductor region and the thickness d1 of the first microcrystalline semiconductor region is greater than or equal to 30 nm.

In addition, an embodiment of the present invention is a thin film transistor including a gate insulating layer which covers a gate electrode, an insulating layer, a back-gate electrode which is in contact with the insulating layer, and a semiconductor layer, impurity semiconductor layers and wirings which are located between the gate insulating layer and the insulating layer. The semiconductor layer includes; a microcrystalline semiconductor region, which is formed on the gate insulating layer side and has a surface having a projection and depression, on the side of the impurity semiconductor layer; and amorphous semiconductor regions which are apart from each other and in contact with part of the microcrystalline semiconductor region. The microcrystalline region includes a first microcrystalline semiconductor region which is not covered with the amorphous semiconductor regions and a second microcrystalline semiconductor region which is in contact with the amorphous semiconductor regions. A thickness d1 of the first microcrystalline semiconductor region is smaller than a thickness d2 of the second microcrystalline semiconductor region and the thickness d1 of the first microcrystalline semiconductor region is greater than or equal to 30 nm.

The microcrystalline semiconductor region and the amorphous semiconductor region included in the semiconductor layer include nitrogen. The maximum concentration of nitrogen is within the range of $1\times10^{20}$ atoms/cm$^3$ to $1\times10^{21}$ atoms/cm$^3$ inclusive, preferably $2\times10^{20}$ atoms/cm$^3$ to $1\times10^{21}$ atoms/cm$^3$ inclusive. Further, in the amorphous semiconductor region, semiconductor crystal grains whose grain size is equal to or greater than 1 nm and equal to or less than 10 nm may be dispersed. Here, the concentration is measured by secondary ion mass spectrometry (SIMS) unless a method for measuring the concentration is mentioned.

Furthermore, the microcrystalline semiconductor region and the amorphous semiconductor region may include an $NH_x$ group (x is 0, 1, or 2) such as an NH group and an $NH_2$ group. In addition, dangling bonds of semiconductor atoms which exist at the interface between adjacent microcrystalline semiconductor regions (i.e., crystal grain boundaries) and the interface between the microcrystalline semiconductor region and the amorphous semiconductor region are cross-linked with an NH group and thus defect levels are reduced, so that a path through which carriers are transported is formed. Alternatively, a dangling bond is terminated with an $NH_2$ group and thus defect levels are reduced.

In the thin film transistor according to one embodiment of the present invention, in the case where the thickness d1 of the first microcrystalline semiconductor region and the thickness d2 of the second microcrystalline semiconductor region have the following relation: d1<d2, and where d1 is greater than or equal to 30 nm, resistance between source and drain electrodes can be reduced when voltage is applied to the source electrode or the drain electrode, whereby on current and field effect mobility of the thin film transistor can be increased. In addition, the amorphous semiconductor region is a well-ordered semiconductor layer which has fewer defects and whose tail of a level at a band edge in the valence band is steep; therefore, the band gap is wide and tunneling current does not easily flow. Therefore, by providing the amorphous semiconductor region on the back channel side, off current of the thin film transistor can be reduced.

Note that "back-channel" refers to a region which does not overlap with the source region or the drain region in the semiconductor layer and which is located on the side of the insulating layer which covers a wiring and the semiconductor layer. Specifically, the back-channel is in a vicinity of a region which is in contact with the insulating layer in the first microcrystalline semiconductor region and in a vicinity of a region which is in contact with the insulating layer in the amorphous semiconductor region.

Note that the term "on current" refers to a current which flows between a source electrode and a drain electrode when a thin film transistor is on. For example, in the case of an n-channel thin film transistor, the on current refers to a current which flows between a source electrode and a drain electrode when a gate voltage is higher than a threshold voltage of a thin film transistor.

In addition, the term "off current" refers to a current which flows between a source electrode and a drain electrode when a thin film transistor is on. For example, in the case of an n-channel thin film transistor, the off current refers to a current which flows between a source electrode and a drain electrode when gate voltage is lower than the threshold voltage of the thin film transistor.

As described above, a thin film transistor with low off current, high on current, and high field effect mobility can be manufactured with high productivity.

DETAILED DESCRIPTION OF THE INVENTION

Figure 1A:
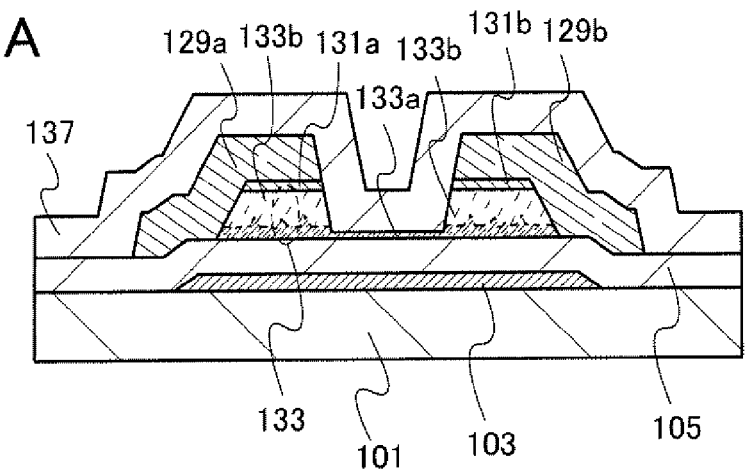
FIGS. 1A to 1D are cross-sectional views each illustrating a thin film transistor according to an embodiment of the present invention.

Hereinafter, embodiments of the present invention are described with reference to the drawings. However, the present invention is not limited to the following description. It is easily understood by those skilled in the art that the modes and details can be variously changed unless departing from the purpose and the scope of the present invention. Therefore, the present invention is not construed as being limited to the following description of the embodiments and example. Note that reference numerals denoting the same portions are used in common in different drawings.

Embodiment 1

In this embodiment, a transistor according to one embodiment of the present invention will be described with reference to FIGS. 1A to 1D, FIG. 2, and FIGS. 3A to 3C. Note that an n-channel thin film transistor has higher carrier mobility than a p-channel thin film transistor. Further, it is preferable that all thin film transistors formed over the same substrate have the same polarity because the number of manufacturing steps can be reduced. In this embodiment, an n-channel thin film transistor will be described.

Figure 1B:
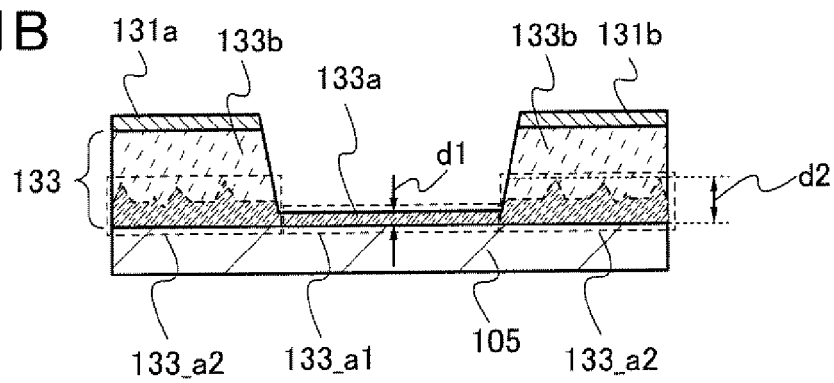

FIGS. 1A and 1B are cross-sectional views of a thin film transistor described in this embodiment.

The thin film transistor described in FIG. 1A includes, over a substrate 101, a gate electrode 103, a semiconductor layer 133, a gate insulating layer 105 provided between the gate electrode 103 and the semiconductor layer 133, impurity semiconductor layers 131a and 131b which are in contact with the semiconductor layer 133 and function as a source region and a drain region, and wirings 129a and 129b which are in contact with the impurity semiconductor layers 131a and 131b. Further, an insulating layer 137 which covers the semiconductor layer 133, the impurity semiconductor layers 131a and 131b, and the wirings 129a and 129b of the thin film transistor is formed.

The semiconductor layer 133 includes a microcrystalline semiconductor region 133a and a pair of amorphous semiconductor regions 133b. A first surface (lower surface) of the microcrystalline semiconductor region 133a is in contact with the gate insulating layer 105. A second surface (upper surface) of the microcrystalline semiconductor region 133a which faces the first surface of the microcrystalline semiconductor region 133a is in contact with the pair of amorphous semiconductor regions 133b and the insulating layer 137. First surfaces of the pair of amorphous semiconductor regions 133b are in contact with the microcrystalline semiconductor region 133a. Second surfaces of the pair of amorphous semiconductor regions 133b which face the first surfaces of the amorphous semiconductor regions 133b are in contact with a pair of impurity semiconductor layers 131a and 131b. That is, in a region of the semiconductor layer 133 which overlaps with the gate electrode 103, the microcrystalline semiconductor region 133a is in contact with the gate insulating layer 105 and the insulating layer 137.

FIG. 1B is an enlarged view of the semiconductor layer 133 in the thin film transistor described in this embodiment. In the microcrystalline semiconductor region 133a, the thickness of a microcrystalline semiconductor region (a first microcrystalline semiconductor region surrounded with a broken line 133_a1) which does not overlap with the impurity semiconductor layers 131a and 131b, has a flat surface and is not covered with the amorphous semiconductor regions 133b is assumed as d1. In the microcrystalline semiconductor region 133a, the thickness of microcrystalline semiconductor regions (second microcrystalline semiconductor regions surrounded with a broken line 133_a2) which are overlapped with the impurity semiconductor layers 131a and 131b and are covered with the amorphous semiconductor regions 133b is assumed as d2. The second microcrystalline semiconductor regions which are overlapped with the impurity semiconductor layers 131a and 131b have surfaces having a projection and depression and d2 refers to a distance between a surface of the gate insulating layer 105 and the tip of the projection portion of the surface having the projection and depression here. Note that, flatness of the first microcrystalline semiconductor region is higher than that of the second microcrystalline semiconductor region.

The thin film transistor of this embodiment, has the following relation: d1<d2 and d1 is greater than or equal to 30 nm. The relation d1<d2 enables field effect mobility of the thin film transistor to be increased. In addition, when d1 is set to be greater than or equal to 30 nm, variations of on current and field effect mobility of the thin film transistor can be reduced and field effect mobility can be increased. Therefore, favorable electrical characteristics of the thin film transistor can be obtained.

Further, the area of the semiconductor layer 133 is smaller than the area of the gate electrode 103 and the entire region of the semiconductor layer 133 overlaps with the gate electrode 103. The gate electrode 103 functions as a light-blocking member against light delivered from a back surface of the substrate 101 (a surface opposite to a surface over which the gate electrode 103 is formed) to the semiconductor layer 133; thus, the amount of light delivered to the semiconductor layer 133 is reduced. Therefore, light leakage current of the thin film transistor can be reduced.

Next, components of the thin film transistor are described below.

As the substrate 101, a glass substrate; a ceramic substrate; a plastic substrate which has high heat resistance enough to withstand a process temperature of this manufacturing process; or the like can be used. In the case where a substrate does not need a light-transmitting property, a substrate in which an insulating layer is provided over a surface of a substrate of a metal such as a stainless steel alloy may be used. As the glass substrate, for example, an alkali-free glass substrate of barium borosilicate glass, aluminoborosilicate glass, aluminosilicate glass, or the like may be used. Note that the size of the substrate 101 is not particularly limited and for example, a glass substrate in the third generation to the tenth generation which is often used in the field of flat panel displays can be used.

The gate electrode 103 can be formed as a single layer or a stacked layer using a metal material such as molybdenum, titanium, chromium, tantalum, tungsten, aluminum, copper, neodymium, scandium, or nickel or an alloy material which contains any of these materials as its main component. Further, a semiconductor material typified by polycrystalline silicon that is doped with an impurity element such as phosphorus, an AgPdCu alloy, an Al—Nd alloy, Al—Ni alloy, or the like may also be used.

For example, as a two layer structure of the gate electrode 103, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, a two-layer structure of a titanium nitride layer and a molybdenum layer, a two-layer structure of a copper-magnesium alloy layer and a copper layer, a two-layer structure of a copper-manganese alloy layer and a copper layer, a two-layer structure of a copper-manganese alloy layer and a copper layer, or the like. Alternatively, a three-layer structure in which a tungsten layer or a tungsten nitride layer, an aluminum-silicon alloy layer or an aluminum-titanium alloy layer, and a titanium nitride layer or a titanium layer are stacked is preferably used. When a metal layer functioning as a barrier layer is stacked over a layer with low electric resistance, electric resistance can be reduced and a metal element of the metal layer can be prevented from diffusing into the semiconductor layer.

The gate insulating layer 105 can be formed in a single layer or a stacked layer using a silicon oxide layer, a silicon nitride layer, a silicon oxynitride layer, or a silicon nitride oxide layer by a CVD method, a sputtering method, or the like. Further, the gate insulating layer 105 is formed using silicon oxide or silicon oxynitride, so that fluctuation in threshold voltage of the thin film transistor can be suppressed.

Here, silicon oxynitride means silicon that includes more oxygen than nitrogen. In the case where measurements are performed using Rutherford backscattering spectrometry (RBS) and hydrogen forward scattering (HFS), it is preferred that silicon oxynitride is estimated to contain oxygen, nitrogen, silicon, and hydrogen as composition ranging from 50 at. % to 70 at. %, 0.5 at. % to 15 at. %, 25 at. % to 35 at. %, and 0.1 at. % to 10 at. %, respectively. Further, silicon nitride oxide means silicon that includes more nitrogen than oxygen. In the case where measurements are performed using RBS and HFS, it is preferred that silicon nitride oxide is estimated to contain oxygen, nitrogen, silicon, and hydrogen as composition ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The semiconductor layer 133 has a structure in which the microcrystalline semiconductor region 133a and the amorphous semiconductor regions 133b are stacked. In this embodiment, the second surface of the microcrystalline semiconductor region 133a has a region having a projection and depression and a flat region.

Figure 1C:
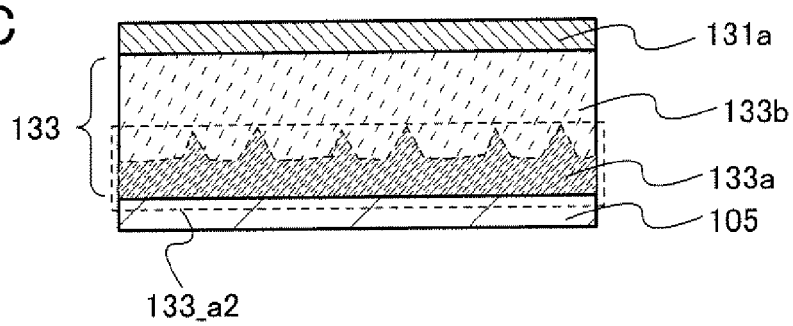
Figure 1D:
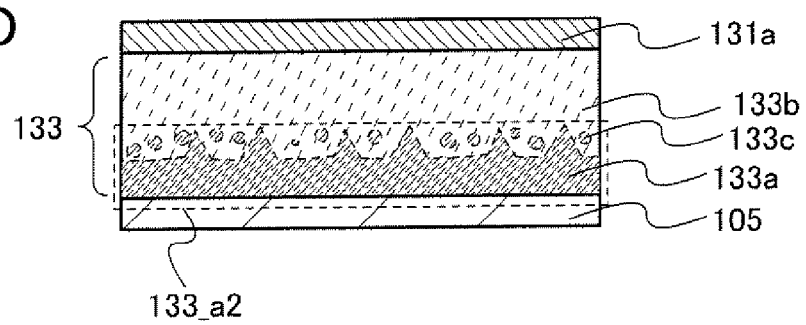

Here, a detailed structure of the semiconductor layer 133 is described. FIGS. 1C and 1D are enlarged views each illustrating a region between the gate insulating layer 105 and the impurity semiconductor layer 131a which functions as a source region or a drain region in the thin film transistor illustrated in FIG. 1A.

As illustrated in FIG. 1C, the surface of the region in the broken line 133_a2 in the microcrystalline semiconductor region 133a has a projection and depression. A projected portion of the microcrystalline semiconductor region 133a has a projected (conical or pyramidal) shape whose width is narrowed from the gate insulating layer 105 toward the amorphous semiconductor region 133b (the tip of the projected portion has an acute angle). Note that the microcrystalline semiconductor region 133a may have a projected portion (inverted conical or inverted pyramidal) whose width is increased from the gate insulating layer 105 toward the amorphous semiconductor region 133b.

The microcrystalline semiconductor region 133a is formed using a microcrystalline semiconductor. The microcrystalline semiconductor is a semiconductor having an intermediate structure between amorphous and crystalline structures (including a single crystal structure and a polycrystalline structure). The microcrystalline semiconductor is a semiconductor having a third state that is thermodynamically stable and is a crystalline semiconductor having short-range order and lattice distortion, in which columnar or needle-like crystal grains having a grain size of from 2 nm to 200 nm, preferably from 10 nm to 80 nm, further preferably from 20 nm to 50 nm growing in a direction normal to the substrate surface. Therefore, there is a case where a crystal grain boundary is formed at the interface of the columnar or needle-like crystal grains. Note that the grain size here means a maximum diameter of a crystal grain in a plane parallel to the substrate surface. Further, the crystal grain includes an amorphous semiconductor region and a crystallite which is a minute crystal that can be regarded as a single crystal. Further, the crystal grain may include a twin crystal.

The Raman spectrum peak of microcrystalline silicon, which is a typical example of a microcrystalline semiconductor, is located in lower wavenumber region than 520 cm$^{-1}$. That is, the peak of the Raman spectrum of the microcrystalline silicon exists between 520 cm$^{-1}$ which represents single crystal silicon and 480 cm$^{-1}$ which represents amorphous silicon. In addition, microcrystalline silicon can be made to contain hydrogen or halogen of at least greater than or equal to 1 at. % for termination of dangling bonds. Moreover, the microcrystalline semiconductor may contain a rare gas element such as helium, argon, krypton, or neon to further promote lattice distortion, so that stability is increased and a favorable microcrystalline semiconductor can be obtained. Such a microcrystalline semiconductor is disclosed in, for example, U.S. Pat. No. 4,409,134.

The thickness d2 of the microcrystal region 133a, that is, a distance between the interface between the gate insulating layer 105 and the semiconductor region 133 and the tip of a protrusion (the projected portion) of the microcrystal region 133a, is from 30 nm to 410 nm inclusive, preferably from 30 nm to 100 nm inclusive, whereby on current and variations of field effect mobility of the thin film transistor can be reduced and the field effect mobility can be increased.

In order to improve the crystallinity of the microcrystalline semiconductor region 133a, the concentrations of oxygen and nitrogen contained in the microcrystalline semiconductor region 133a which are estimated by secondary ion mass spectrometry are preferably set to less than $1\times10^{18}$ atoms/cm$^3$.

The amorphous semiconductor region 133b is formed using an amorphous semiconductor including nitrogen. Nitrogen in the amorphous semiconductor may exist, for example, as an NH$_x$ group (x is 0, 1, or 2) such as an NH group or an NH$_2$ group. The amorphous semiconductor is formed, for example, using amorphous silicon.

Here, an amorphous semiconductor including nitrogen is a semiconductor having lower energy at an Urbach edge measured by a constant photocurrent method (CPM) or photoluminescence spectroscopy, and contribution of the absorption spectrum of lattice defects is small as compared to a conventional amorphous semiconductor. That is, as compared to the conventional amorphous semiconductor, the amorphous semiconductor including nitrogen is a well-ordered semiconductor which has fewer defects and whose tail of a level at a band edge in the valence band is steep. Since the amorphous semiconductor including nitrogen has a steep tail of a level at a band edge in the valence band, the band gap is wider and tunneling current does not easily flow. Therefore, by providing the amorphous semiconductor including nitrogen on the back channel side, off current of the thin film transistor can be reduced.

Further, a peak in a low-temperature photoluminescent spectrum of the amorphous semiconductor including nitrogen is observed in a range from 1.31 eV to 1.39 eV inclusive. Note that a peak of a low-temperature photoluminescent spectrum of microcrystalline silicon, which is a typical example of a microcrystalline semiconductor, is located in a region ranging from 0.98 eV to 1.02 eV inclusive. This means that the amorphous semiconductor including nitrogen is different from the microcrystalline semiconductor.

Similarly to the amorphous semiconductor region 133b, the microcrystalline semiconductor region 133a may also include an NH group or an NH$_2$ group.

As illustrated in FIG. 1D, a semiconductor crystal grain 133c having a diameter of 1 nm to 10 nm inclusive, preferably 1 nm to 5 nm inclusive, may be included in the amorphous semiconductor region 133b, so that the on current and the field effect mobility can be increased.

The microcrystalline semiconductor having a projected (conical or pyramidal) shape whose tip is narrowed from the gate insulating layer 105 toward the amorphous semiconductor region 133b or the microcrystalline semiconductor having a projected shape whose width increased from the gate insulating layer 105 toward the amorphous semiconductor region 133b is formed in the following manner: a microcrystalline semiconductor layer is formed under the condition that a microcrystalline semiconductor is deposited, which is followed by deposition of an amorphous semiconductor under the condition that the crystal growth is suppressed.

Since the semiconductor layer 133 of the thin film transistor described in this embodiment has a region with a conical or pyramidal shape, or an inverted conical or inverted pyramidal shape, it is possible to reduce resistance in a vertical direction (a thickness direction), that is, resistance of the semiconductor layer 133 when the thin film transistor is in an on state and voltage is applied between the source and drain electrodes. The amorphous semiconductor including nitrogen which has fewer defects and whose tail of a level at a band edge in the valence band is steep is provided between the microcrystalline semiconductor region and the impurity semiconductor layer; therefore, tunneling current does not easily flow. Accordingly, on current and field effect mobility of the thin film transistor can be increased and off current thereof can be reduced.

The impurity semiconductor layers 131a and 131b are formed using amorphous silicon to which an impurity such as phosphorus is added, microcrystalline silicon to which the impurity such as is added, or the like. In addition, the impurity semiconductor layers 131a and 131b may each have a stacked layer structure of amorphous silicon to which an impurity is added and microcrystalline silicon to which an impurity is added. Note that, in the case where a p-channel thin film transistor is formed as a thin film transistor, the impurity semiconductor layers 131a and 131b are formed using microcrystalline silicon to which an impurity such as boron is added, amorphous silicon to which an impurity such as boron is added, or the like. In the case where the semiconductor layer 133 achieves an ohmic contact with the wirings 129a and 129b, the impurity semiconductor layers 131a and 131b need not be formed.

Further, in the case where the impurity semiconductor layers 131a and 131b are formed with microcrystalline silicon to which an impurity such as phosphorous and boron, a microcrystalline semiconductor layer, typically a microcrystalline silicon layer, may be additionally formed between the semiconductor layer 133 and the impurity semiconductor layers 131a and 131b, so that characteristics of the interface can be improved. As a result, resistance generated at the interface between the impurity semiconductor layers 131a and 131b and the semiconductor layer 133 can be reduced. Consequently, the amount of current flowing through the source region, the semiconductor layer, and the drain region of the thin film transistor can be increased and on current and field effect mobility can be increased.

The wirings 129a and 129b can be formed as a single layer or a stacked layer using any of aluminum, copper, titanium, neodymium, scandium, molybdenum, chromium, tantalum, tungsten, and the like. An aluminum alloy to which an element for preventing a hillock is added (e.g., an Al—Nd alloy which can be used for the gate electrode 103) may also be used. Alternatively, crystalline silicon to which an impurity element which serves as a donor is added may be used. Further, the wirings 129a and 129b may have a stacked-layer structure obtained as follows; a layer, which is in contact with the crystalline silicon to which an impurity element serving as a donor is added, is formed using titanium, tantalum, molybdenum, tungsten, or nitride of any of these elements, and then aluminum or an aluminum alloy is formed thereover. Further alternatively, the wirings 129a and 129b may have a stacked-layer structure in which an upper side and a lower side of aluminum or an aluminum alloy is sandwiched together with titanium, tantalum, molybdenum, tungsten, or nitride of any of these elements.

Figure 2:
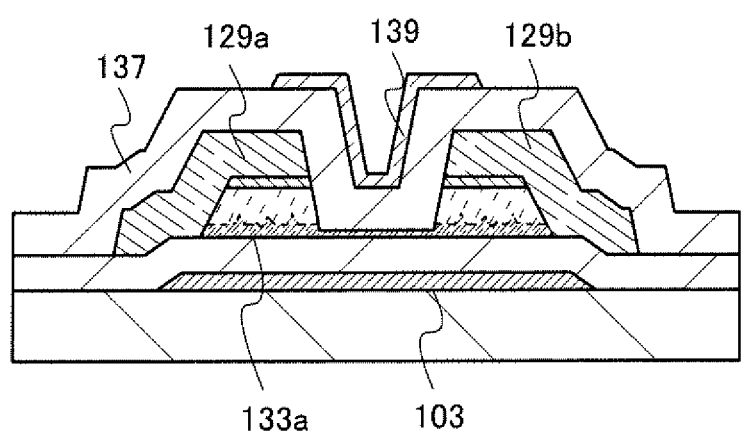
FIG. 2 is a cross-sectional view illustrating a thin film transistor according to an embodiment of the present invention.

In addition, the thin film transistor can have a dual-gate structure as illustrated in FIG. 2. That is, the thin film transistor can include the insulating layer 137 which covers the thin film transistor illustrated in FIG. 1A and an electrode which is provided over the insulating layer 137 and overlaps with the semiconductor layer 133. Here, an electrode which faces the semiconductor layer 133 with the insulating layer 137 interposed therebetween is denoted by a back-gate electrode 139.

In the dual-gate transistor, each of potentials applied to the gate electrode 103 and the back-gate electrode 139 can be different from each other. Therefore, a threshold voltage of the thin film transistor can be controlled. Alternatively, the potentials of the gate electrode 103 and the back-gate electrode 139 can be set the same as each other. Therefore, channels are formed in the vicinity of the first and second surfaces of the microcrystalline semiconductor region 133a.

In the dual-gate thin film transistor described in this embodiment, there are two channels in which carriers flow in the microcrystalline semiconductor region 133a: in the vicinity of the first surface on the gate insulating layer 105 side and in the vicinity of the second surface on the insulating layer 137 side. Therefore, the amount of carrier transport is increased and the on current and field effect mobility can be increased. Accordingly, the area of the thin film transistor can be reduced and the thin film transistors can be highly integrated in a semiconductor device. By using the thin film transistor described in this embodiment for a driver circuit of a display device, the size of the driver circuit can be decreased so that a frame size of the display device can be narrowed.

The insulating layer 137 can be formed in a manner similar to that for the gate insulating layer 105. In addition, the insulating layer 137 can be formed using an organic resin layer. As the examples of the organic resin layer, an acrylic resin, an epoxy resin, a polyimide, a polyamide, polyvinylphenol, a benzocyclobutene-based resin, and the like can be used. A siloxane polymer can also be used.

The back-gate electrode 139 can be formed in a manner similar to that for the wirings 129a and 129b. Further, the back-gate electrode 139 can be formed using indium oxide including tungsten oxide, indium zinc oxide including tungsten oxide, indium oxide including titanium oxide, indium tin oxide including titanium oxide, indium tin oxide, indium zinc oxide, indium tin oxide to which silicon oxide is added, or the like.

Alternatively, the back-gate electrode 139 can be formed using a conductive composition including a conductive high molecule (also referred to as a conductive polymer) having a light-transmitting property. The back-gate electrode 139 preferably has a sheet resistance of less than or equal to 10000 $\Omega$/square, and a light transmittance of greater than or equal to 70% at a wavelength of 550 nm. Further, the resistivity of the conductive high molecule included in the conductive composition is preferably less than or equal to 0.1 $\Omega \cdot$cm.

As the conductive high molecule, a so-called $\pi$-electron conjugated conductive high molecule can be used. For example, polyaniline and/or a derivative thereof, polypyrrole and/or a derivative thereof, polythiophene and/or a derivative thereof, and a copolymer of two or more of aniline, pyrrole, and thiophene and/or a derivative thereof can be given.

Next, the shape of a back-gate electrode is described with reference to FIGS. 3A to 3C which are plan views of the thin film transistor.

Figure 3A:
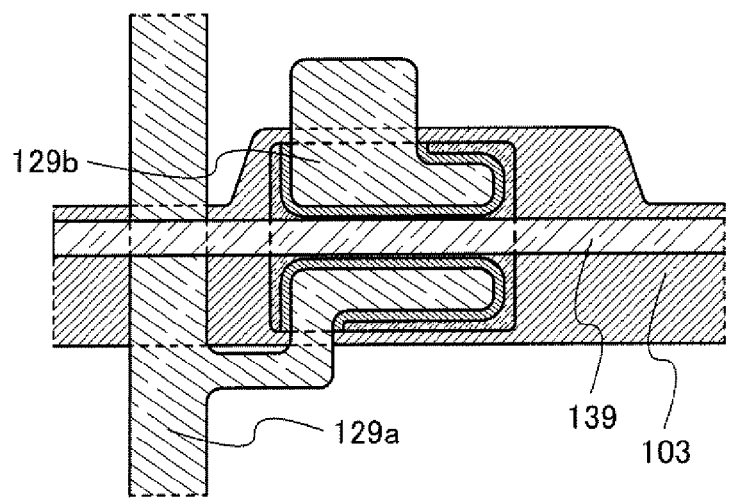
FIGS. 3A to 3C are top views each illustrating a thin film transistor according to an embodiment of the present invention.

As illustrated in FIG. 3A, the back-gate electrode 139 can be formed parallel to the gate electrode 103. In this case, the potential applied to the back-gate electrode 139 and the potential applied to the gate electrode 103 can be separately and arbitrarily controlled. In this manner, a threshold voltage of the thin film transistor can be controlled.

Figure 3B:
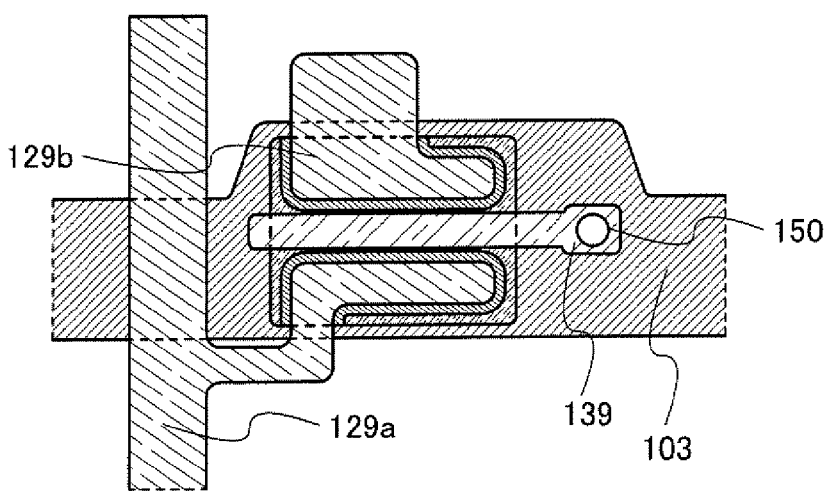

As illustrated in FIG. 3B, the back-gate electrode 139 can be connected to the gate electrode 103. That is, at the opening 150 formed in the gate insulating layer 105 and the insulating layer 137, the gate electrode 103 and the back-gate electrode 139 can be connected to each other. In this case, the potential applied to the back-gate electrode 139 and the potential applied to the gate electrode 103 are equal. As a result, in the semiconductor layer, the regions in which carriers flow, that is, the channels, are formed in the gate insulating layer 105 side and the insulating layer 137 side in the microcrystalline semiconductor region; thus, the on current of the thin film transistor can be increased.

Figure 3C:
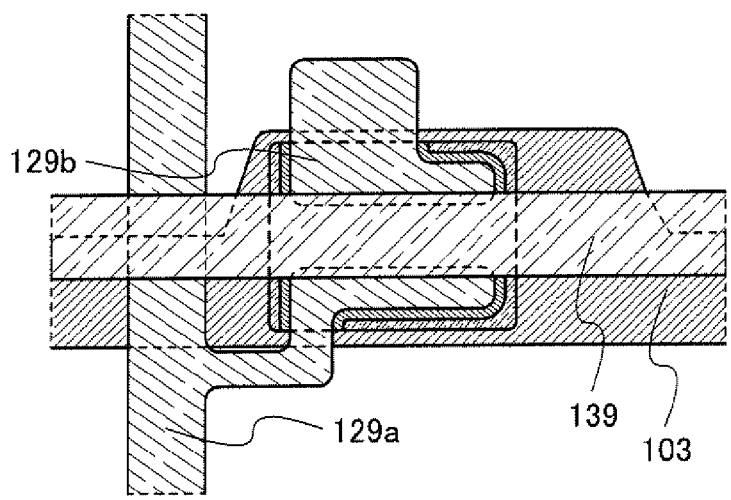

As illustrated in FIG. 3C, the back-gate electrode 139 may overlap with the wirings 129a and 129b with the insulating layer 137 interposed therebetween. Although the back-gate electrode 139 having the structure of FIG. 3A is used in FIG. 3C, the back-gate electrode 139 of FIG. 3B may also overlap with the wirings 129a and 129b.

The thin film transistor described in this embodiment includes the semiconductor layer formed of the microcrystalline semiconductor region which is in contact with the gate insulating layer and the amorphous semiconductor region including nitrogen which has fewer defects, whose tail of a level at a band edge in the valence band is steep and which is well-ordered. Therefore, the thin film transistor has a large amount of on current, high field effect mobility, and a small amount of off current. The thickness of a region in a microcrystalline semiconductor region, which has a flat surface and is not covered with the amorphous semiconductor region, is d1. The thickness of a region in the microcrystalline semiconductor region, which is covered with the amorphous semiconductor region, is d2. When the relation d1<d2 is satisfied and d1 is greater than or equal to 30 nm, the on current and the field effect mobility are increased and variations of electrical characteristics among a plurality of elements can be reduced. Accordingly, by using the thin film transistor as a pixel switching element, a display device with high contrast and high image quality can be manufactured. In addition, since the area of the thin film transistor can be reduced, by manufacturing a driver circuit using the thin film transistor, the frame of the display device can be narrowed.

Note that this embodiment can be combined with any of the other embodiments as appropriate.

Embodiment 2

In this embodiment, a thin film transistor having a structure different from that of Embodiment 1 will be described with reference to FIG. 4. In this embodiment, the shape of a semiconductor layer is different from that of Embodiment 1.

Figure 4:
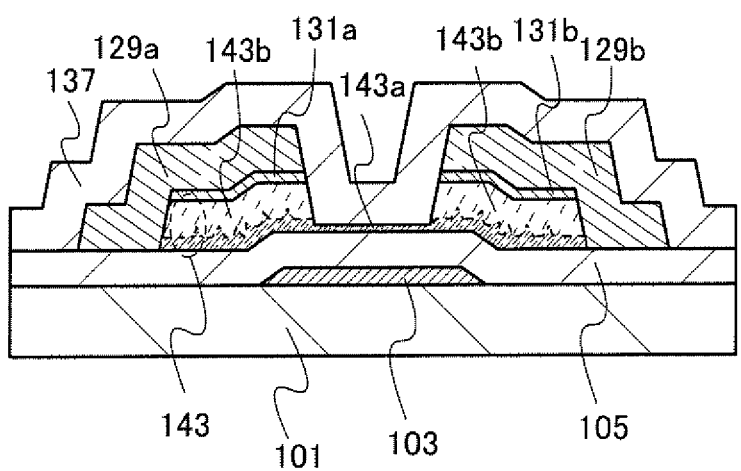
FIG. 4 is a cross-sectional view illustrating a thin film transistor according to an embodiment of the present invention.

The thin film transistor illustrated in FIG. 4 includes, over the substrate 101, the gate electrode 103, a semiconductor layer 143, the gate insulating layer 105 provided between the gate electrode 103 and the semiconductor layer 143, the impurity semiconductor layers 131a and 131b which are in contact with the semiconductor layer 143 and function as a source region and a drain region, and the wirings 129a and 129b which are in contact with the impurity semiconductor layers 131a and 131b. The insulating layer 137 is formed so as to cover the semiconductor layer 143, the impurity semiconductor layers 131a and 131b, and the wirings 129a and 129b.

The semiconductor layer 143 includes a microcrystalline region 143a and a pair of amorphous semiconductor regions 143b. A first surface of the microcrystalline semiconductor region 143a is in contact with the gate insulating layer 105 and a second surface of the microcrystalline semiconductor region 143a, which is facing the first surface, is in contact with the pair of amorphous semiconductor regions 143b and the insulating layer 137. First surfaces of the amorphous semiconductor regions 143b are in contact with the microcrystalline semiconductor region 143a and second surfaces of the amorphous semiconductor regions 143b, which are facing the first surfaces of the 143b, are in contact with the pair of impurity semiconductor layers 131a and 131b. That is, in a region of the semiconductor layer 143 which overlaps with the gate electrode 103, part of the microcrystalline semiconductor region 143a is in contact with the gate insulating layer 105 and the insulating layer 137.

In addition, the semiconductor layer 143 has a lager area than the gate electrode 103 and the end portion of the semiconductor layer 143 does not overlap with the gate electrode 103. Although a Schottky junction is formed at regions in which the microcrystalline semiconductor region 143a of the semiconductor layer 143 is in contact with the wirings 129a and 129b, application of a negative voltage to the gate electrode 103 does not cause influence of electric field due to the negative voltage to the regions in which the semiconductor layer 143 is in contact with the wirings 129a and 129b. Therefore, off current of the thin film transistor can be reduced.

Embodiment 3

In this embodiment, a manufacturing method of the thin film transistors illustrated in FIGS. 1A to 1D and FIG. 2 will be described with reference to FIGS. 5A to 5C and FIGS. 6A to 6D. In this embodiment, a method for manufacturing an n-channel thin film transistor will be described.

Figure 5A:
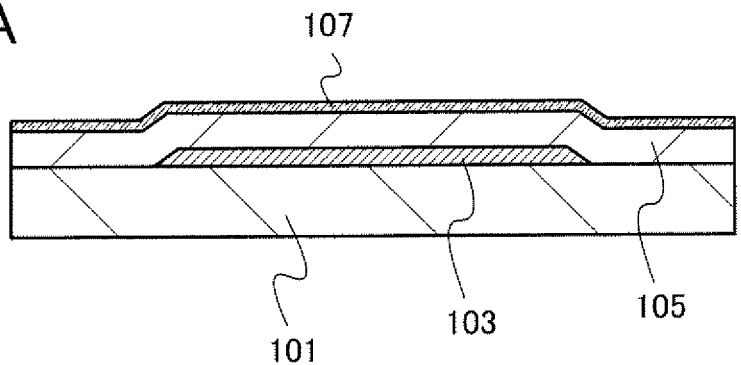
FIGS. 5A to 5C are cross-sectional views each illustrating a thin film transistor according to an embodiment of the present invention.

As illustrated in FIG. 5A, the gate electrode 103 is formed over the substrate 101. Then, the gate insulating layer 105 and the microcrystalline semiconductor layer 107 are formed so as to cover the gate electrode 103.

As the substrate 101, the substrate 101 described in Embodiment 1 can be used as appropriate.

The gate electrode 103 is formed using any of the materials used for the gate electrode 103 described in Embodiment 1 as appropriate. The gate electrode 103 can be formed in such a manner that a conductive layer is formed over the substrate 101, using the above material by a sputtering method or a vacuum evaporation method, a mask is formed over the conductive layer by a photolithography method, an inkjet method, or the like, and the conductive layer is etched using the mask. Further, the gate electrode 103 can be formed by discharging a conductive nanopaste of silver, gold, copper, or the like over the substrate by an inkjet method and baking the conductive nanopaste. In order to improve adhesion between the gate electrode 103 and the substrate 101, a layer of a nitride of any of the above metal materials may be provided between the substrate 101 and the gate electrode 103. Here, a conductive layer is formed over the substrate 101 and then etched using a resist mask formed using a photomask.

Note that side surfaces of the gate electrode 103 are preferably tapered. This is in order to prevent disconnection at a step portion, because an insulating layer, a semiconductor layer, and a wiring layer are formed over the gate electrode 103 in subsequent steps. In order to form the side surfaces of the gate electrode 103 into a tapered shape, etching may be performed while the resist mask is made to recede.

Through the process of forming the gate electrode 103, a gate wiring (a scan line) and a capacitor wiring can also be formed at the same time. Note that a "scanning line" means a wiring which selects a pixel, while a "capacitor wiring" means a wiring which is connected to one of electrodes of a storage capacitor in a pixel. However, without limitation thereto, the gate electrode 103 and either or both a gate wiring and a capacitor wiring may be formed separately.

The gate insulating layer 105 can be formed by a CVD method, a sputtering method, or the like using the material given in Embodiment 1. In a process of forming the gate insulating layer 105 by a CVD method, glow discharge plasma is generated by applying high-frequency power with a frequency of 3 MHz to 30 MHz, typically 13.56 MHz or 27.12 MHz, or high-frequency power in the VHF band with a frequency of 30 MHz to about 300 MHz, typically 60 MHz. Alternatively, the glow discharge plasma is generated by applying high frequency power at a microwave frequency of 1 GHz or more. With the use of high-frequency power in the VHF band or with a microwave frequency, the deposition rate can be increased. Note that a pulsed oscillation by which high-frequency power is applied in a pulsed manner or a continuous oscillation by which high-frequency power is applied continuously may be applied. In addition, by superimposing high-frequency power in the HF band and high-frequency power in the VHF band on each other, unevenness of plasma in a large-sized substrate is also reduced, so that uniformity can be improved and the deposition rate can be increased. When the gate insulating layer 105 is formed at a high frequency (1 GHz or more) using a microwave plasma CVD apparatus, the withstand voltage between the gate electrode and the drain and source electrodes can be improved, so that a highly reliable thin film transistor can be obtained.

By forming a silicon oxide layer by a CVD method using an organosilane gas as the gate insulating layer 105, the crystallinity of the semiconductor layer which is formed later can be improved, so that on current and field effect mobility of the thin film transistor can be increased. As an organosilane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The microcrystalline semiconductor layer 107 is formed using a microcrystalline semiconductor layer typified by a microcrystalline silicon layer, a microcrystalline silicon-germanium layer, a microcrystalline germanium layer, or the like. The thickness of the microcrystalline semiconductor layer 107 is preferably 30 nm to 100 nm, further preferably, 30 nm to 50 nm. In the case where the microcrystalline semiconductor layer 107 is too thin, on current of the thin film transistor is reduced. In the case where the microcrystalline semiconductor layer 107 is too thick, off current of the thin film transistor is increased when the thin film transistor operates at a high temperature. The thickness of the microcrystalline semiconductor layer 107 is set to 30 nm to 100 nm, preferably, 30 nm to 50 nm, whereby on current and off current of the thin film transistor can be controlled.

In a reaction chamber of the plasma CVD apparatus, the microcrystalline semiconductor layer 107 is formed by glow discharge plasma with use of a mixed gas which includes hydrogen and a deposition gas containing silicon or germanium. Alternatively, the microcrystalline semiconductor layer 107 is formed by glow discharge plasma with a mixture of a deposition gas containing silicon or germanium, hydrogen, and a rare gas such as helium, neon, or krypton. Microcrystalline microcrystalline silicon-germanium, microcrystalline germanium, or the like is formed using a mixture which is obtained by diluting the deposition gas containing silicon or germanium with hydrogen whose flow rate is 10 to 2000 times, preferably 10 to 200 times that of the deposition gas. The deposition temperature in that case is preferably a room temperature to 300° C., further preferably, 200° C. to 280° C.

As typical examples of the deposition gas containing silicon or germanium, $SiH_4$, $Si_2H_6$, $GeH_4$, and $Ge_2H_6$ are given.

In the case where the gate insulating layer 105 is formed using a silicon nitride layer, at an early stage of deposition of the microcrystalline semiconductor layer 107, an amorphous semiconductor region is easily formed. In such a case, crystallinity of the microcrystalline semiconductor layer 107 is low and electric characteristics of the thin film transistor are poor. Therefore, when the gate insulating layer 105 is formed using a silicon nitride layer, a microcrystalline semiconductor layer 107 is preferably deposited under the condition that the dilution rate of the deposition gas containing silicon or germanium is high or under the low temperature condition. Typically, the high dilution rate condition in which the flow rate of hydrogen is 200 to 2000 times, further preferably 250 to 400 times that of the deposition gas containing silicon or germanium is preferable. In addition, the low temperature condition in which the temperature for deposition of the microcrystalline semiconductor layer 107 is 200° C. to 250° C. is preferable. When the high dilution rate condition or the low temperature condition is employed, density of crystal nuclei formed at an initial stage is increased, an amorphous component over the gate insulating layer 105 is reduced, and crystallinity of the microcrystalline semiconductor layer 107 is improved. Furthermore, when the surface of the gate insulating layer 105 formed using a silicon nitride layer is oxidized, the adhesion with the microcrystalline semiconductor layer 107 is improved. As the oxidation treatment, exposure to an oxidizing gas, plasma treatment in an oxidation gas, or the like can be given.

A rare gas such as helium, argon, neon, krypton, or xenon is used as a diluting gas for the formation of the microcrystalline semiconductor layer 107, whereby the deposition rate of the microcrystalline semiconductor layer 107 can be increased. When the deposition rate is increased, the amount of impurities mixed into the microcrystalline semiconductor layer 107 can be reduced, whereby the crystallinity of the microcrystalline semiconductor layer 107 can be improved. Accordingly, on current and field effect mobility of the thin film transistor are increased and throughput of the thin film transistor can also be increased.

When the microcrystalline semiconductor layer 107 is formed, glow discharge plasma is generated by applying high frequency power with a frequency of 3 MHz to 30 MHz, typically, high-frequency power of 13.56 MHz or 27.12 MHz in the HF band, or high-frequency power of approximately 30 MHz to 300 MHz in the VHF band, typically 60 MHz. Alternatively, glow discharge plasma is generated by applying high frequency power at a microwave frequency of 1 GHz or more. Note that the high-frequency power can be applied in a pulsed manner or a continuous manner. In addition, by superimposing high-frequency power in the HF band and high-frequency power in the VHF band on each other, unevenness of plasma in a large-sized substrate is also reduced, so that uniformity can be improved and the deposition rate can be increased.

Note that before the microcrystalline semiconductor layer 107 is formed, impurity elements in the treatment chamber of the CVD apparatus are removed by introducing a deposition gas containing silicon or germanium while exhausting the air in the treatment chamber, so that the amount of the impurity elements in the microcrystalline semiconductor layer 107 can be reduced, and thus, electric characteristics of the thin film transistor can be improved. Further, before the microcrystalline semiconductor layer 107 is formed, plasma may be generated in an atmosphere containing fluorine such as a fluorine atmosphere, a nitrogen fluoride atmosphere, or a silane fluoride atmosphere, and the gate insulating layer 105 may be exposed to the fluorine plasma, whereby the dense microcrystalline semiconductor layer 107 can be formed.

Figure 5B:
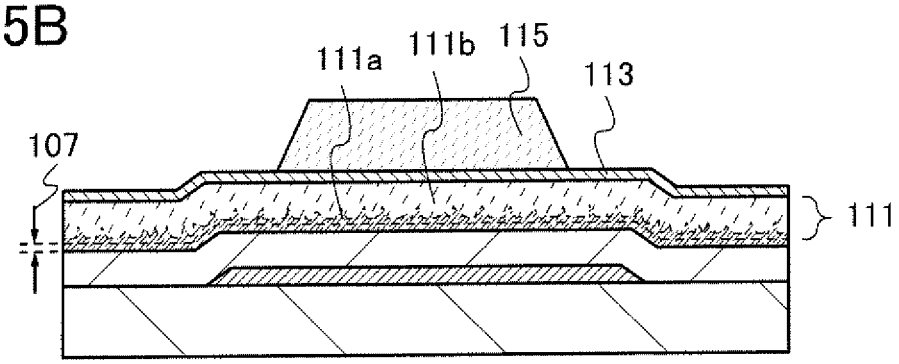

Next, as illustrated in FIG. 5B, a semiconductor layer 111 is formed over the microcrystalline semiconductor layer 107. The semiconductor layer 111 includes a microcrystalline semiconductor region 111a and an amorphous semiconductor region 111b. Next, an impurity semiconductor layer 113 is formed over the semiconductor layer 111. Then, a resist mask 115 is formed over the impurity semiconductor layer 113.

The semiconductor layer 111 including the microcrystalline semiconductor region 111a and the amorphous semiconductor region 111b can be formed by allowing the crystal growth to partly take place with use of the microcrystalline semiconductor layer 107 as a crystal seed (i.e., by deposition of the amorphous semiconductor under the condition that the crystal grow is suppressed).

In the treatment chamber of the plasma CVD apparatus, the semiconductor layer 111 is formed by glow discharge plasma with use of a mixed gas which includes a deposition gas containing silicon or germanium, hydrogen, and a gas containing nitrogen. Examples of the gas containing nitrogen include ammonia, nitrogen, nitrogen fluoride, nitrogen chloride, chloroamine, fluoroamine, and the like. Glow discharge plasma can be generated as in the case of the microcrystalline semiconductor layer 107.

In this case, a flow ratio of the deposition gas containing silicon or germanium to hydrogen is the same as that for forming a microcrystalline semiconductor layer 107, and a gas containing nitrogen is used for the source gas, whereby crystal growth can be suppressed as compared to the deposition condition of the microcrystalline semiconductor layer 107. Specifically, since a gas containing nitrogen is included in the source gas, the crystal growth is suppressed at an early stage of deposition of the semiconductor layer 111; therefore, a conical or pyramidal microcrystalline semiconductor region grows, and an amorphous semiconductor region is formed. Furthermore, in the middle stage or later stage of deposition, the crystal growth of the conical or pyramidal microcrystalline semiconductor region is stopped, and only the amorphous semiconductor region is deposited. As a result, in the semiconductor layer 111, the microcrystalline semiconductor region 111a and the amorphous semiconductor region 111b which is formed as a well-ordered semiconductor layer having fewer defects and a steep tail of a level at a band edge in the valence band, can be formed.

Here, in the formation of the semiconductor layer 111, the flow rate of hydrogen is typically 10 to 2000 times, preferably, 10 to 200 times that of the deposition gas containing silicon or germanium. Note that in a typical example of a normal condition for forming an amorphous semiconductor layer, the flow rate of hydrogen is 0 to 5 times that of the deposition gas containing silicon or germanium.

A rare gas such as helium, neon, argon, krypton, or xenon is introduced into the source gas of the semiconductor layer 111, whereby the deposition rate of the semiconductor layer 111 can be increased.

It is preferable for the semiconductor layer 111 to have a thickness of 50 nm to 350 nm, and further preferable to have a thickness of 120 nm to 250 nm.

Here, the semiconductor layer 111 including the microcrystalline semiconductor region 111a and the amorphous semiconductor region 111b is formed with use of a source gas of the semiconductor layer 111, which includes a gas containing nitrogen. Alternatively, the semiconductor layer 111 is formed with use of a source gas which includes hydrogen and a deposition gas containing silicon or germanium after nitrogen is absorbed on the surface of the microcrystalline semiconductor layer 107 by exposing the surface of the microcrystalline semiconductor layer 107 to a gas containing nitrogen. Accordingly, the semiconductor layer 111 including the microcrystalline semiconductor region 111a and the amorphous semiconductor region 111b can be formed.

The impurity semiconductor layer 113 is formed by glow discharge plasma with a mixture of a deposition gas containing silicon, hydrogen, and an impurity such as phosphine (diluted with hydrogen or silane) in the reactive chamber of the plasma CVD apparatus. Amorphous silicon to which an impurity is added or microcrystalline silicon to which an impurity is added is formed by diluting the deposition gas containing silicon with hydrogen. In the case of manufacturing a p-channel thin film transistor, the impurity semiconductor layer 113 may be formed by glow discharge plasma using diborane as an impurity.

Next, with use of a resist mask 115, the microcrystalline semiconductor layer 107, the semiconductor layer 111, and the impurity semiconductor layer 113 are etched. Through this step, the microcrystalline semiconductor layer 107, the semiconductor layer 111, and the impurity semiconductor layer 113 are divided for each element to form a semiconductor layer 117 and the impurity semiconductor layer 121. Note that the semiconductor layer 117 is part of the microcrystalline semiconductor layer 107 and the semiconductor layer 111 and includes a microcrystalline semiconductor region 117a and an amorphous semiconductor region 117b. Then, the resist mask is removed.

Note that the resist mask 115 can be formed by a photolithography step.

Figure 6A:
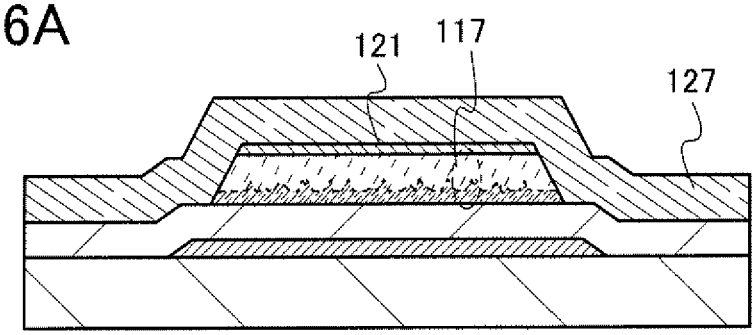
FIGS. 6A to 6D are cross-sectional views each illustrating a thin film transistor according to an embodiment of the present invention.

Next, a conductive layer 127 is formed over the impurity semiconductor layer 121 (see FIG. 6A). The conductive layer 127 can be formed using a material similar to that of the wirings 129a and 129b described in Embodiment 1 as appropriate. The conductive layer 127 is formed by a CVD method, a sputtering method, or a vacuum evaporation method. Alternatively, the conductive layer 127 may be formed by discharging a conductive nanopaste of silver, gold, copper, or the like by a screen printing method, an ink-jet method, or the like and baking the conductive nanopaste.

Figure 6B:
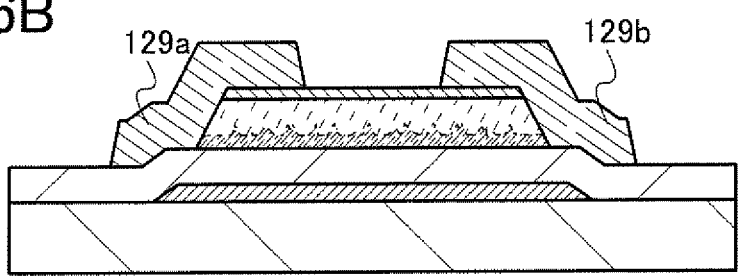

Then, a resist mask is formed by a photolithography step, and the conductive layer 127 is etched with use of the resist mask, so that the wirings 129a and 129b functioning as a source electrode and a drain electrode are formed (see FIG. 6B). The etching of the conductive layer 127 may be either dry etching or wet etching. Note that one of the wirings 129a and 129b functions as a signal line as well as a source electrode or a drain electrode. However, without limitation thereto, a signal line may be provided independently in addition to the source and drain electrodes.

Next, the impurity semiconductor layer 121 and the semiconductor layer 117 are partly etched, so that a pair of the impurity semiconductor layers 131a and 131b functioning as source and drain regions are formed. Also, the semiconductor layer 133 including the microcrystalline semiconductor region 133a and the pair of amorphous semiconductor regions 133b is formed. At this point, etching of the semiconductor layer 117 is performed so that the microcrystalline semiconductor region 133a is exposed and the surface thereof is flat, whereby the semiconductor layer 133 has the following structure. In regions which are covered with the wirings 129a and 129b, the microcrystalline semiconductor region 133a and the amorphous semiconductor region 133b are stacked, and in a region which is not covered with the wirings 129a and 129b but overlaps with the gate electrode, the microcrystalline semiconductor region 133a is exposed (see FIG. 6C).

Since dry etching is used in the etching step here, the ends of the wirings 129a and 129b are aligned with ends of the impurity semiconductor layers 131a and 131b. If the conductive layer 127 is subjected to wet etching and the impurity semiconductor layer 121 is subjected to dry etching, the ends of the wirings 129a and 129b and the ends of the impurity semiconductor layers 131a and 131b are not aligned. In a cross section in such a case, the ends of the wirings 129a and 129b are positioned on the inner side than the ends of the impurity semiconductor layers 131a and 131b.

Next, the structure obtained through the steps up to here may be subjected to dry etching. The dry etching is performed with a low etching rates of the microcrystalline semiconductor region 133a and the amorphous semiconductor region 133b so that the exposed microcrystalline semiconductor region 133a and the amorphous semiconductor region 133b are not damaged. In other words, the employed condition is that almost no damage is given to the surfaces of the exposed microcrystalline semiconductor region 133a and the amorphous semiconductor region 133b and the thicknesses of the exposed microcrystalline semiconductor region 133a and the amorphous semiconductor region 133b are hardly reduced. As an etching gas, $Cl_2$, $CF_4$, $N_2$, or the like is typically used. There is no particular limitation on an etching method and an inductively coupled plasma (ICP) method, a capacitively coupled plasma (CCP) method, an electron cyclotron resonance (ECR) method, a reactive ion etching (RIE) method, or the like can be used.

Further, the exposed surfaces of the microcrystalline semiconductor region 133a and the amorphous semiconductor region 133b may be subjected to plasma treatment typified by water plasma treatment, oxygen plasma treatment, ammonia plasma treatment, nitrogen plasma treatment, or the like.

Water plasma treatment can be performed in such a manner that a gas containing water typified by water vapor ($H_2O$ vapor) as a main component is introduced into a reaction space, and plasma is generated. After that, the resist mask is removed. Note that removal of the resist mask may be performed before the dry etching.

As described above, after formation of the microcrystalline semiconductor region 133a and the amorphous semiconductor region 133b, dry etching is additionally performed under a condition that no damages is given the microcrystalline semiconductor region 133a and the amorphous semiconductor region 133b, whereby an impurity such as a residue existing on the exposed surfaces of the microcrystalline semiconductor region 133a and the amorphous semiconductor region 133b can be removed. Further, after the dry etching, water plasma treatment is successively performed, whereby a residue of the resist mask can also be removed. By the plasma treatment, insulation between the source region and the drain region can be ensured, and thus, in a thin film transistor which is completed, the off current can be reduced, and variations in electric characteristics can be reduced.

Through the above steps, a thin film transistor including a channel formation region which is formed using a microcrystalline semiconductor layer, like the thin film transistor illustrated in FIG. 1A can be manufactured. Further, a thin film transistor with low off current, high on current, and high field effect mobility can be manufactured with high productivity.

Next, the insulating layer 137 is formed. The insulating layer 137 can be formed in a manner similar to that for the gate insulating layer 105.

Next, an opening (not illustrated) is formed in the insulating layer 137 with use of a resist mask formed by a photolithography step. Then, the back-gate electrode 139 is formed (see FIG. 6D).

The back-gate electrode 139 can be formed in the following manner: a thin film is formed using the materials described in Embodiment 1 by a sputtering method; and the film is etched using a resist mask that is formed by a photolithography step. Alternatively, the back-gate electrode 139 can be formed by applying or printing a conductive composition including a conductive high molecule having a light-transmitting property, and baking the composition.

Through the above steps, the dual-gate thin film transistor as illustrated in FIG. 2 can be manufactured.

Note that this embodiment can be applied to any of the other embodiments

Embodiment 4

In this embodiment, a mode of a pixel 200 in a display portion will be described with reference to FIG. 7, FIGS. 8A to 8C, FIG. 9, FIGS. 10A and 10B, and FIGS. 11A and 11B.

Figure 7:
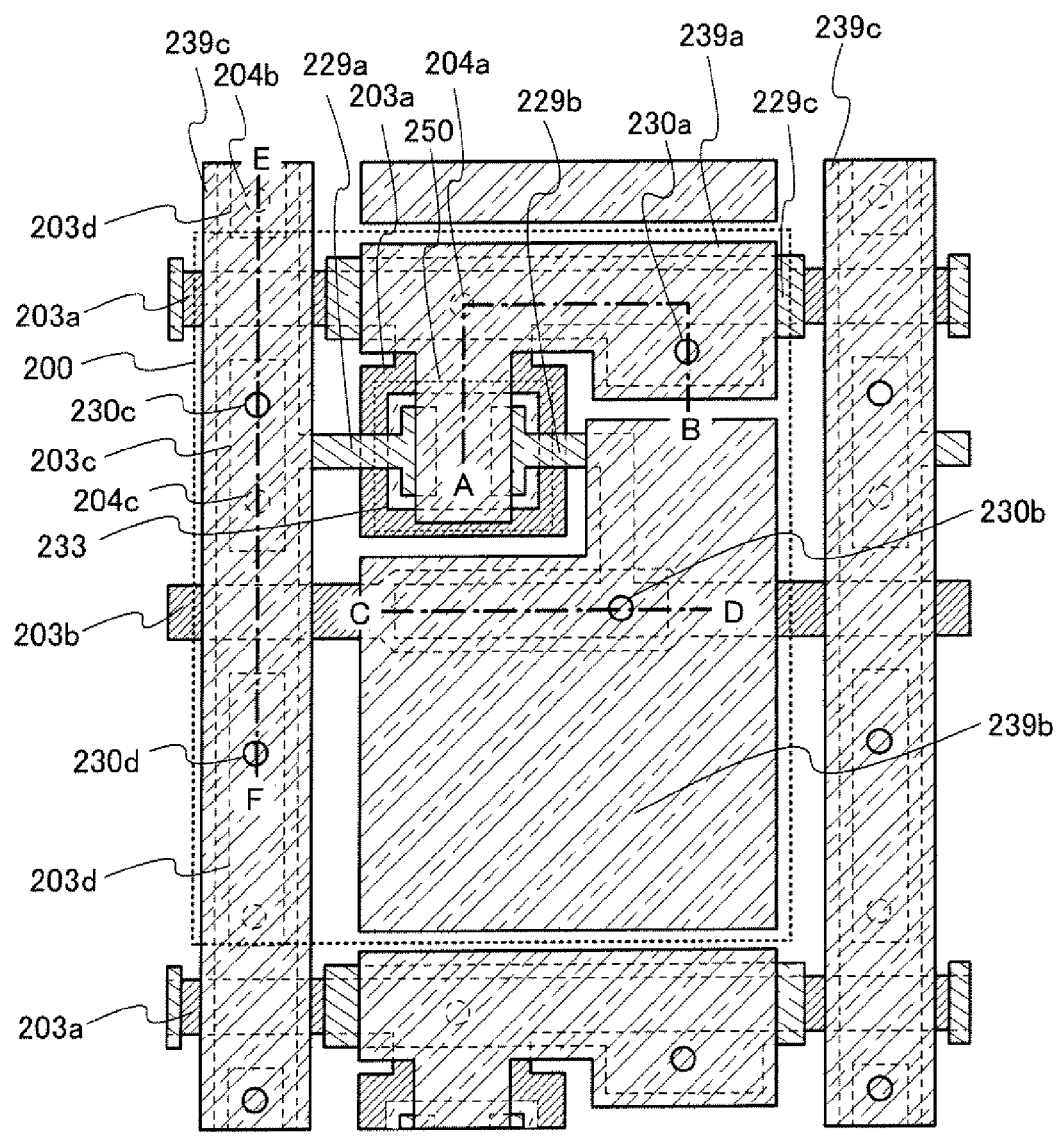
FIG. 7 is a top view illustrating a pixel structure.

FIG. 7 is a top view illustrating a pixel 200 in a display portion of a display device. In the pixel 200, a thin film transistor 250 and a pixel electrode 239b which is connected to the thin film transistor 250 are formed.

The thin film transistor 250 can be formed using any of the thin film transistors described in Embodiments 1 to 3. The thin film transistor 250 includes a gate electrode which is a part of a scan line 203a, a semiconductor layer 233, one of a source electrode and a drain electrode which is part of a signal line 229a, the other of the source electrode and the drain electrode, which is denoted by reference numeral 229b, a back-gate electrode 239a, a gate insulating layer which is not illustrated, and an insulating layer formed between the signal line 229a and the back-gate electrode 239a. In addition, a capacitor wiring 203b is formed in parallel to the scan line 203a.

In this embodiment, a conductive layer formed in the same level as the gate electrode (the scan line 203a) of the thin film transistor is a first conductive layer, a conductive layer formed in the same level as the source electrode and a drain electrode (the signal line 229a) of the thin film transistor is a second conductive layer, and a conductive layer formed in the same level as the back-gate electrode 239a and the pixel electrode 239b of the thin film transistor is a third conductive layer.

Figure 8A:
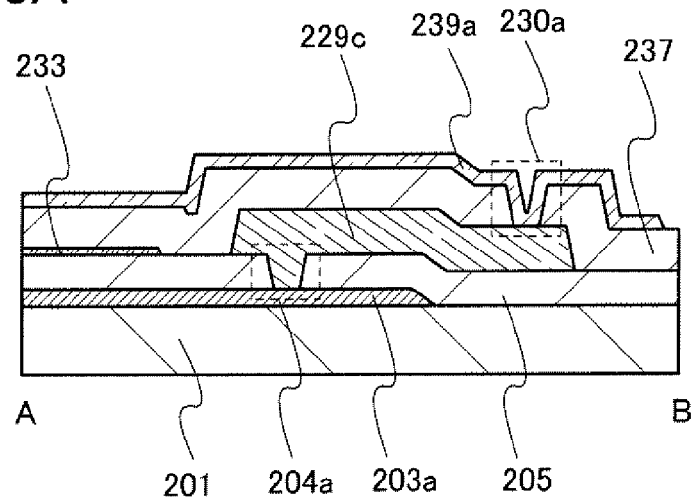
FIGS. 8A to 8C are cross-sectional views each illustrating a pixel structure.

FIG. 8A is a cross sectional view taken along a line A-B of FIG. 7. The cross sectional view includes a connection region of the scan line 203a and the back-gate electrode 239a.

In FIG. 8A, the scan line 203a is formed over a substrate 201, and a gate insulating layer 205 is formed over the scan line 203a. The semiconductor layer 233 and a second conductive layer 229c are formed over the gate insulating layer 205. An insulating layer 237 is formed over the semiconductor layer 233 and the second conductive layer 229c, and the back-gate electrode 239a is formed over the insulating layer 237. In an opening 204a, the scan line 203a and the second conductive layer 229c are connected to each other, and in an opening 230a, the second conductive layer 229c and the back-gate electrode 239a are connected to each other. That is, the scan line 203a and the back-gate electrode 239a are electrically connected through the second conductive layer 229c.

Figure 8B:
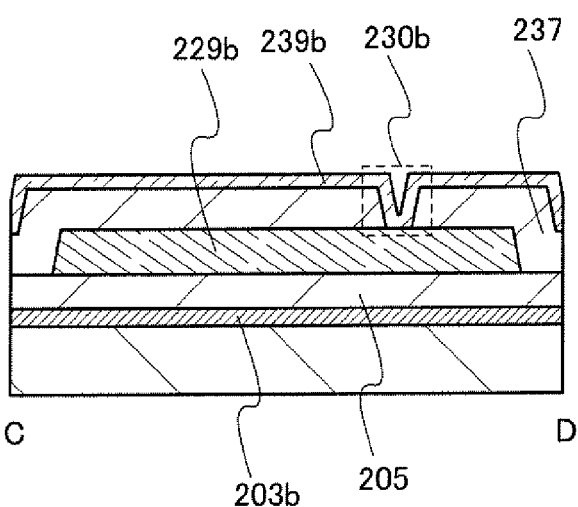

Next, a cross sectional view of a part of the capacitor along a line C-D is illustrated in FIG. 8B.

In FIG. 8B, the capacitor wiring 203b is formed over the substrate 201 and the gate insulating layer 205 is formed over the capacitor wiring 203b. The other of the source electrode and the drain electrode 229b, is formed over the gate insulating layer 205. The insulating layer 237 is formed over the other of the source electrode and the drain electrode 229b, and the pixel electrode 239b is formed over the insulating layer 237. In the opening 230b, the other of the source electrode and the drain electrode 229b and the pixel electrode 239b are connected to each other. That is, the capacitor includes the capacitor wiring 203b, the gate insulating layer 205, and the other of the source electrode and the drain electrode 229b.

Figure 8C:
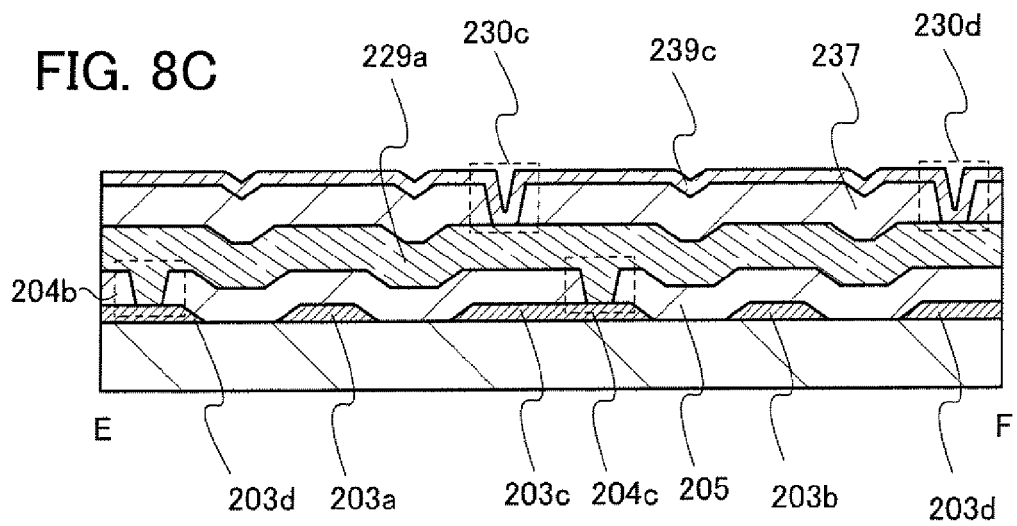

Then, a cross-sectional view of a part of the signal line along a line E-F is illustrated in FIG. 8C.

In FIG. 8C, the scan line 203a, the capacitor wiring 203b, first conductive layers 203c and 203d are formed over the substrate 201, and the gate insulating layer 205 is formed thereover. The signal line 229a is formed over the gate insulating layer 205. The insulating layer 237 is formed over the signal line 229a and a third conductive layer 239c is formed over the insulating layer 237. The first conductive layer 203d and the signal line 229a are connected to each other in an opening 204b, and the first conductive layer 203c and the signal line 229a are connected to each other in an opening 204c. In openings 230c and 230d, the signal line 229a and the third conductive layer 239c are connected to each other. That is, the first conductive layers 203c and 203d, the signal line 229a and the third conductive layer 239c form a multi-layer structure and each of them has the same potential. Therefore, wiring resistance of the signal line 229a can be reduced and a signal can be input to the signal line 229a at high speed. Accordingly, a display device manufactured over a large-sized substrate can realize high-frame-rate driving, such as double-frame rate driving, triple-frame rate driving, or the like and has excellent display characteristics.

Figure 9:
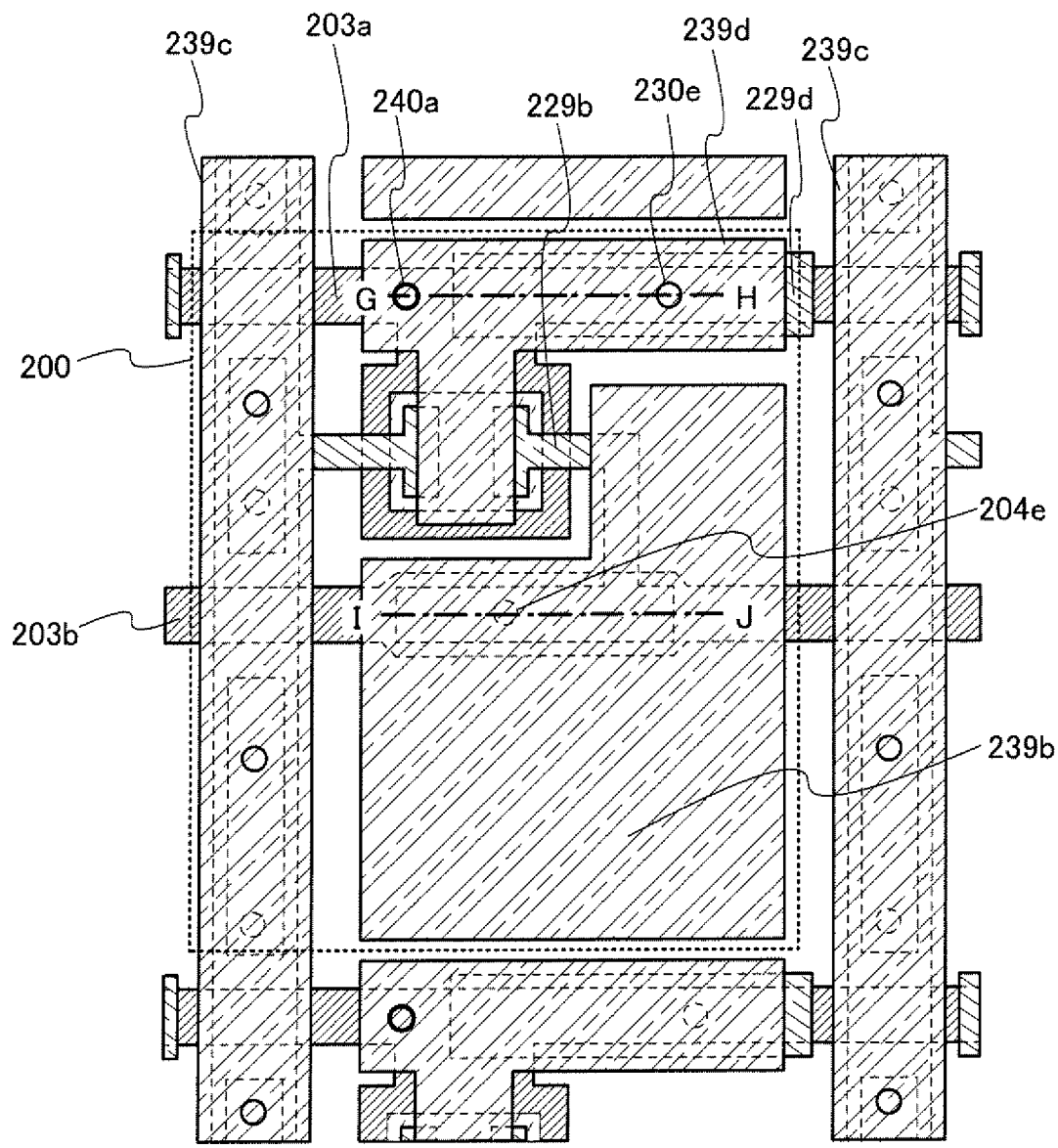
FIG. 9 is a top view illustrating a pixel structure.

A modified example of the pixel 200 is illustrated in FIG. 9. Here, structures of a connection region of the scan line 203a and the back-gate electrode 239d and a capacitor, which are different from FIG. 7, are described.

Figure 10A:
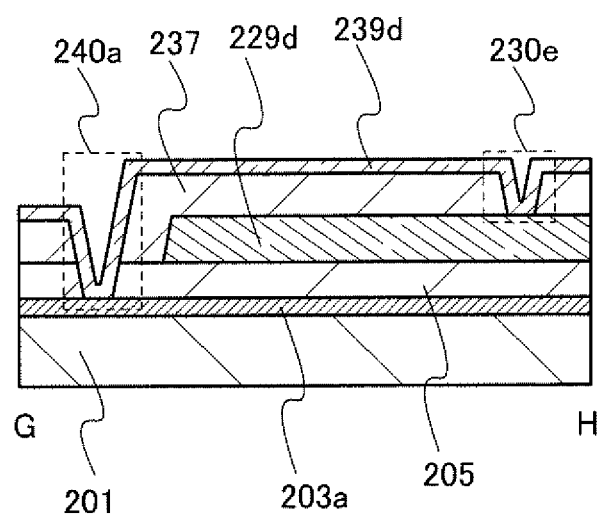
FIGS. 10A and 10B are cross-sectional views each illustrating a pixel structure.

FIG. 10A is a cross-sectional view taken along a line G-H of FIG. 9. The cross-sectional view includes a connection region of the scan line 203a and the back-gate electrode 239d.

In FIG. 10A, the scan line 203a is formed over the substrate 201, and the gate insulating layer 205 is formed over the scan line 203a. The second conductive layer 229d is formed over the gate insulating layer 205. The insulating layer 237 is formed over the second conductive layer 229d and the back-gate electrode 239d is formed over the insulating layer 237. The scan line 203a and the back-gate electrode 239d are connected to each other in the opening 240a, and the second conductive layer 229d and the back-gate electrode 239d are connected to each other in the opening 230e. That is, the scan line 203a, the second conductive layer 229d, and the back-gate electrode 239d are electrically connected to each other.

Figure 10B:
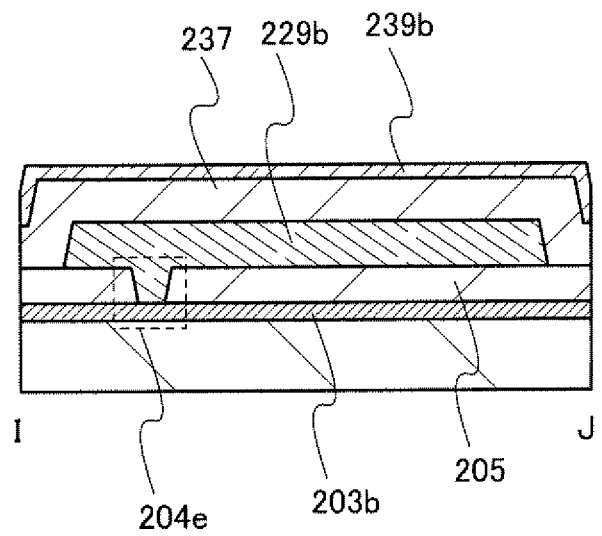

Next, a cross-sectional view of a part of the capacitor along a line is illustrated in FIG. 10B.

In FIG. 10B, the capacitor wiring 203b is formed over the substrate 201, and the gate insulating layer 205 is formed over the capacitor wiring 203b. The other of the source electrode and the drain electrode 229b is formed over the gate insulating layer 205. The insulating layer 237 is formed over the other of the source electrode and the drain electrode 229b, and the pixel electrode 239b is formed over the insulating layer 237. In the opening 204e, the capacitor wiring 203b and the other of the source electrode and the drain electrode 229b are connected to each other. That is, the capacitor includes the other of the source electrode and the drain electrode 229b, the insulating layer 237, and the pixel electrode 239b.

Note that although not illustrated here, without formation of the opening 204e in FIG. 10B, the first capacitor can be formed including the capacitor wiring 203b, the gate insulating layer 205, and the other of the source electrode and the drain electrode 229b, and the second capacitor can be formed including the other of the source electrode and the drain electrode 229b, the insulating layer 237, and the pixel electrode 239b. With such a structure, two capacitors can be formed in a pixel, so that capacity in one pixel can be increased, whereby the area of a capacitor can be reduced and the aperture ratio of the pixel can be increased.

Modified examples of the structure of the openings illustrated in FIGS. 8A to 8C and FIGS. 10A and 10B are described with reference to FIGS. 11A and 11B. Note that although modified examples of the opening 230a in FIG. 8A are described here, the modified examples can be applied to FIGS. 8B and 8C and FIGS. 10A and 10B.

Figure 11A:
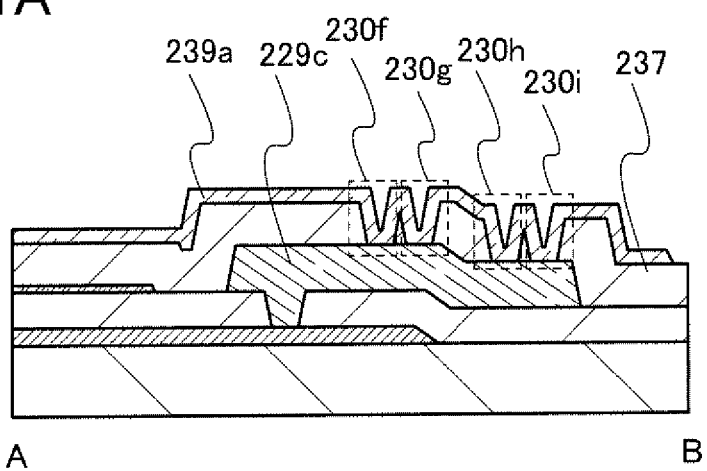
FIGS. 11A and 11B are cross-sectional views each illustrating a structure of an opening.

In FIG. 11A, the second conductive layer 229c and the back-gate electrode 239a are connected to each other in a plurality of openings 230f to 230i. Since the second conductive layer 229c and the back-gate electrode 239a are connected to each other in the plurality of the openings, electrical connection can be performed surely between the second conductive layer 229c and the back-gate electrode 239a.

Figure 11B:
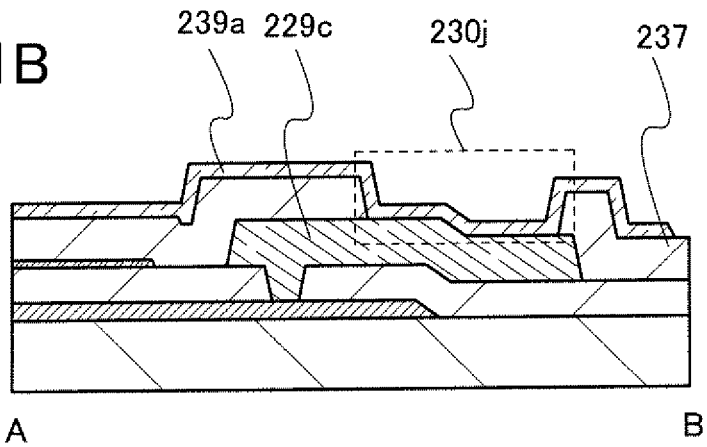

Alternatively, as illustrated in FIG. 11B, the second conductive layer 229c and the back-gate electrode 239a may be connected to each other in an opening 230j which has a large opening area. Thus, contact area between the second conductive layer 229c and the back-gate electrode 239a is large.

With openings having such a shape, contact area between the second conductive layer 229c and the back-gate electrode 239a can be increased.

Embodiment 5

In this embodiment, a pixel structure by which display defects can be reduced will be described with reference to FIGS. 12A and 12B.

Figure 12A:
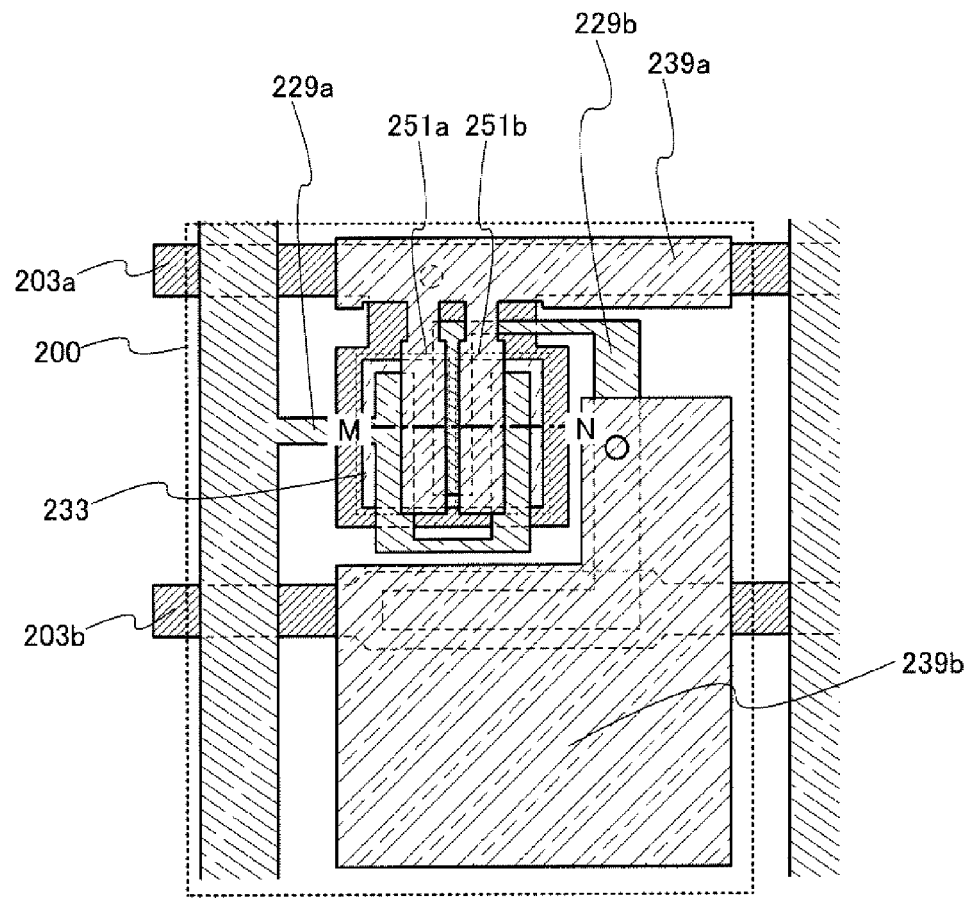
FIGS. 12A and 12B are a top view and a cross-sectional view illustrating a pixel structure.

FIG. 12A is a top view of the pixel 200 in a display portion of a display device. In the pixel 200, thin film transistors 251a and 251b and the pixel electrode 239b which is connected to each of the thin film transistors 251a and 251b are formed.

The thin film transistors 251a and 251b can be formed using any of the thin film transistors described in Embodiments 1 to 3. Each of the thin film transistors 251a and 251b includes a gate electrode which is part of the scan line 203a, the semiconductor layer 233, the impurity semiconductor layers 231a and 231b, one of the source electrode and the drain electrode which is part of the signal line 229a, the other of the source electrode and the drain electrode 229b, the back-gate electrode 239a, the gate insulating layer which is not illustrated, and the insulating layer formed between the signal line 229a and the back-gate electrode 239a. The capacitor wiring 203b is formed parallel to the scan line 203a. Since the thin film transistors 251a and 251b include the one of the source electrode and the drain electrode which is part of the signal line 229a and the other of the source electrode and the drain electrode 229b in common, they are connected in parallel.

Figure 12B:
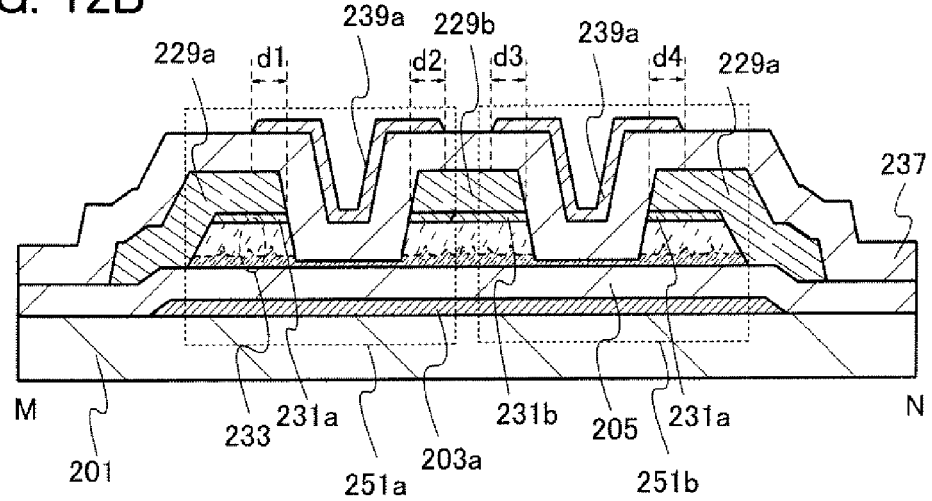

A cross-sectional view of the thin film transistors 251a and 251b along a line M-N is illustrated in FIG. 12B.

In the thin film transistors 251a and 251b illustrated in FIG. 12B, the scan line 203a is formed over the substrate 201, and the gate insulating layer 205 is formed over the scan line 203a. In addition, over the gate insulating layer 205, the semiconductor layer 233, the impurity semiconductor layers 231a and 231b, the one of the source electrode and the drain electrode which is part of the signal line 229a, and the other of the source electrode and the drain electrode 229b are formed. The insulating layer 237 is formed over the semiconductor layer 233, the impurity semiconductor layers 231a and 231b, the signal line 229a, and the other of the source electrode and the drain electrode 229b. The back-gate electrode 239a is formed over the insulating layer 237.

Here, in the case where the signal line 229a is a drain and the other of source electrode and the drain electrode 229b is a source, it is assumed, in the thin film transistor 251a, that the width of a region where the drain and the back-gate electrode 239a overlap with each other is d1 and the width of a region where the source and the back-gate electrode 239a overlap with each other is d2. In the thin film transistor 251b, it is assumed that the width of a region where the drain and the back-gate electrode 239a overlap with each other is d4, and the width of a region where source and the back-gate electrode 239a overlap with each other is d3. In the thin film transistors 251a and 251b, parasitic capacitance between the source and the back-gate electrode 239a is formed in the overlapping portion having a width d2 and the overlapping portion having a width d3, and parasitic capacitance between the drain and the back gate electrode 239a is formed in the overlapping portion having a width d1 and the overlapping portion having a width d4. Therefore, even when positions of the back-gate electrode 239a, the one of the source electrode and the drain electrode which is part of the signal line 229a, and the other of the source electrode and the drain electrode 229b are displaced, the thin film transistors 251a and 251b are connected in parallel so that the total capacitance of the parasitic capacitance of the thin film transistors are constant. Thus, every parasitic capacitance of the signal line 229a in each pixel can be constant.

Thus, it is possible to design so that variations of parasitic capacitance generated in a signal line are reduced, variations in delay time of wirings are reduced, and signal in the signal line is transmitted at high speed. Accordingly, a display device manufactured over a large-sized substrate can realize high-frame-rate driving, such as double-frame rate driving, triple-frame rate driving, or the like and has excellent display characteristics.

Embodiment 6

In this embodiment, a wiring structure by which display defects can be reduced will be described with reference to FIGS. 13A and 13B.

Figure 13A:
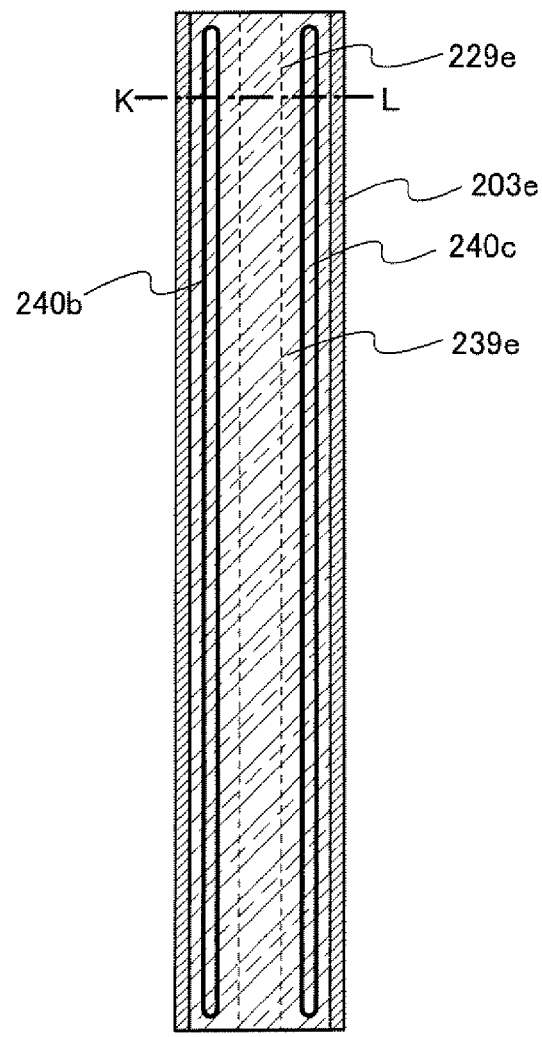
FIGS. 13A and 13B are a top view and a cross-sectional view illustrating a wiring structure.

FIG. 13A is a top view of a signal line 229e in which a first conductive layer 203e formed in the same layer as a gate electrode of a thin film transistor and a third conductive layer 239e formed in the same layer as a back-gate electrode and a pixel electrode are formed.

Figure 13B:
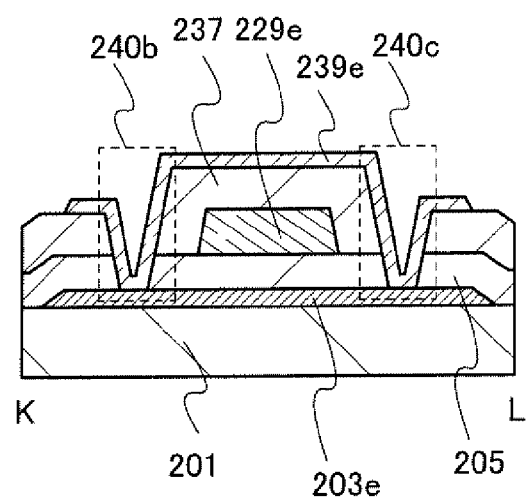

In FIG. 13B, a cross-sectional structure along a line K-L in FIG. 13A is described.

In FIG. 13B, the first conductive layer 203e is formed over the substrate 201, and the gate insulating layer 205 is formed over the first conductive layer 203e. The signal line 229e is formed over the gate insulating layer 205. The insulating layer 237 is formed over the signal line 229e and the third conductive layer 239e is formed over the insulating layer 237. In addition, in openings 240b and 240c, the first conductive layer 203e and the third conductive layer 239e are connected to each other. That is, the signal line 229e is covered with the first conductive layer 203e and the third conductive layer 239e which have the same potentials with the gate insulating layer 205 and the insulating layer 237 interposed therebetween. Therefore, even when a wiring (for example, a power supply line) through which a large amount of current flows to the vicinity of the signal line is provided, the first conductive layer 203e and the third conductive layer 239e can block noise caused by the wiring through which a large amount of current flows. Accordingly, a potential of the signal line 229e can be set to a predetermined potential so that display defects can be reduced.

Note that by reducing parasitic capacitance generated between the signal line 229e and the third conductive layer 239e, a signal in the signal line can be transmitted at high speed.

Note that although in this embodiment, the signal line is described, the structure described in FIGS. 13A and 13B can be applied to other wirings.

Embodiment 7

A thin film transistor of an embodiment of the present invention is manufactured, and a semiconductor device having a display function (also referred to as a display device) can be manufactured using the thin film transistor in a pixel portion and further in a driver circuit. Further, part or whole of a driver circuit can be formed over the same substrate as a pixel portion, using the thin film transistor, whereby a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

In addition, the display device includes a panel in which the display element is sealed, and a module in which an IC and the like including a controller are mounted on the panel. Furthermore, an element substrate, which corresponds to one mode before the display element is completed in a manufacturing process of the display device, is provided with a means for supplying current to the display element in each of a plurality of pixels. Specifically, the element substrate may be in a state in which only a pixel electrode of the display element is provided, a state after formation of a conductive film to be a pixel electrode and before etching of the conductive film to form the pixel electrode, or any other states.

Note that a display device in this specification means an image display device, a display device, or a light source (including a lighting device). Further, the "display device" includes the following modules in its category: a module including a connector such as a flexible printed circuit (FPC), a tape automated bonding (TAB) tape, or a tape carrier package (TCP) attached; a module having a TAB tape or a TCP which is provided with a printed wiring board at the end thereof; and a module having an integrated circuit (IC) which is directly mounted on a display element by a chip on glass (COG) method.

Embodiment 8

A semiconductor device disclosed in this specification can be applied to electronic paper. An electronic paper can be used for electronic devices of a variety of fields as long as they can display data. For example, electronic paper can be applied to an electronic book (e-book) reader, a poster, an advertisement in a vehicle such as a train, a digital signage, a public information display (PID), displays of various cards such as a credit card, and the like. An example of the electronic device is illustrated in FIG. 14.

Figure 14:
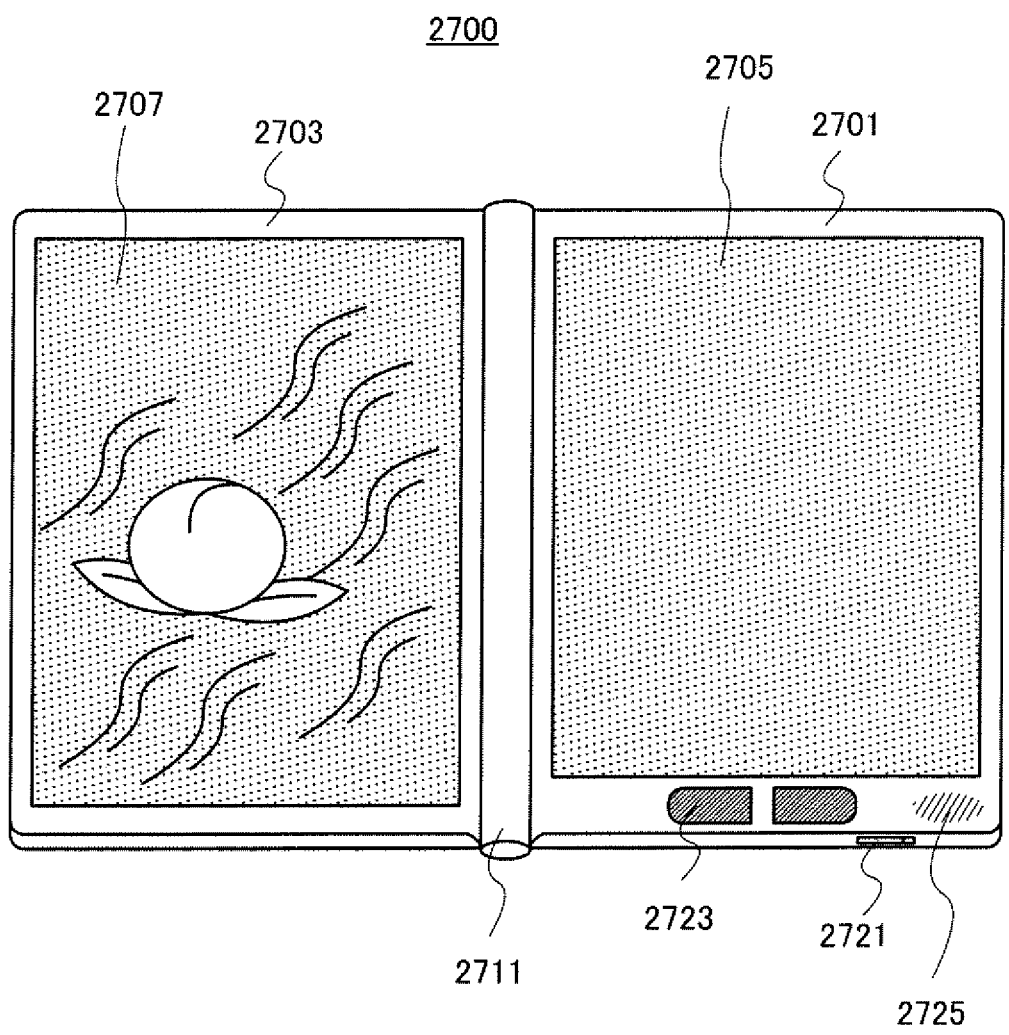
FIG. 14 is an external view illustrating an example of an electronic book reader.

FIG. 14 illustrates an electronic book reader 2700 as an example. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 14) and graphics can be displayed on a display portion on the left side (the display portion 2707 in FIG. 14).

FIG. 14 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Embodiment 9

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 15A:
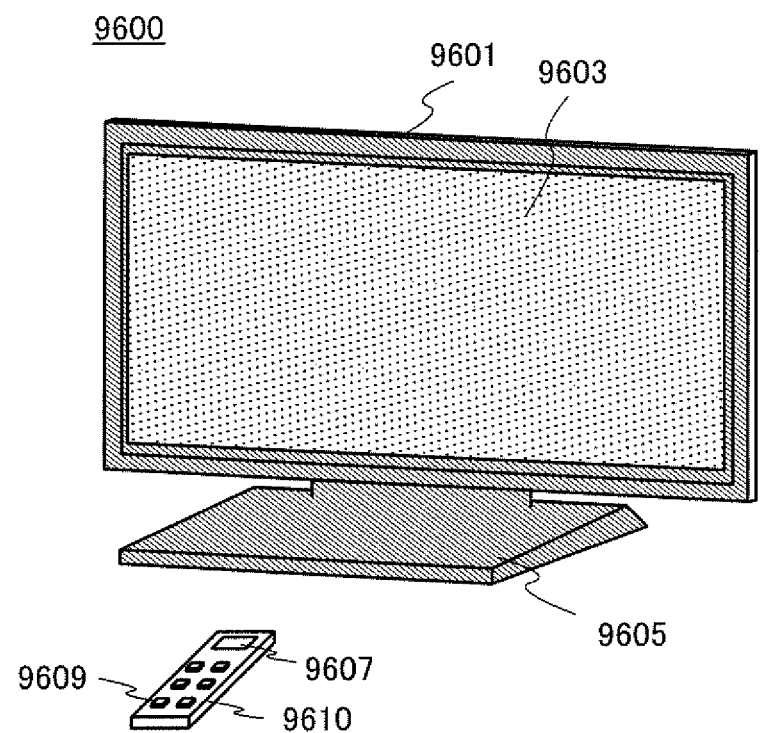
FIG. 15A is an external view of an example of a television device and FIG. 15B is an external view of an example of a digital photo frame.

FIG. 15A illustrates a television set 9600 as an example. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 15B:
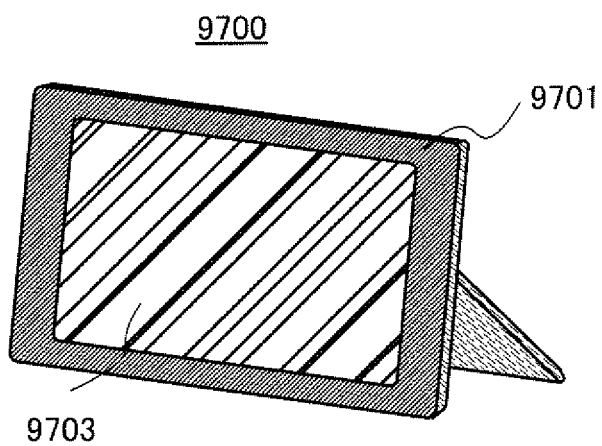

FIG. 15B illustrates a digital photo frame 9700 as an example of a digital photo frame. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 16:
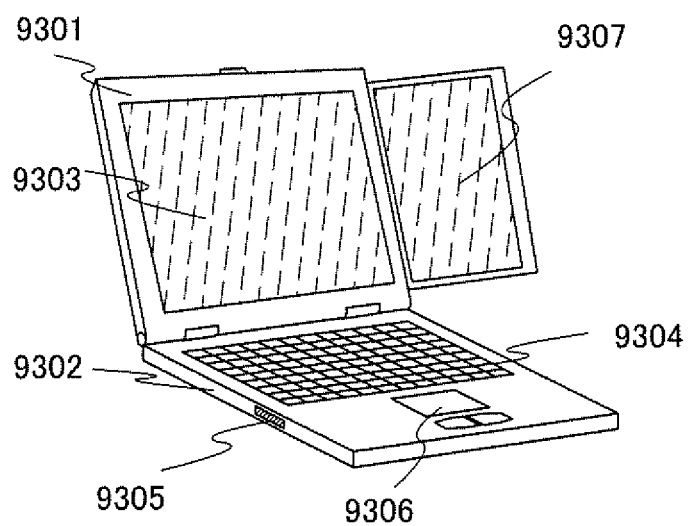
FIG. 16 is a perspective view illustrating an example of a portable computer.

FIG. 16 is a perspective view illustrating an example of a portable computer.

In the portable computer of FIG. 16, a top housing 9301 having a display portion 9303 and a bottom housing 9302 having a keyboard 9304 can overlap with each other by closing a hinge unit which connects the top housing 9301 and the bottom housing 9302. The portable computer of FIG. 16 is convenient for carrying, and in the case of using the keyboard for input, the hinge unit is opened and the user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes an external connection port 9305 into which another device, for example, a communication cable conformable to communication standards of a USB is inserted.

The top housing 9301 includes a display portion 9307 and can keep the display portion 9307 therein by sliding it toward the inside of the top housing 9301; thus, the top housing 9301 can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed with an image display device of a liquid crystal display panel, a light-emitting display panel such as an organic light-emitting element or an inorganic light-emitting element, or the like.

In addition, the portable computer illustrated in FIG. 16 can be provided with a receiver and the like and can receive a TV broadcast to display an image on the display portion. The user can watch television broadcast when the whole screen of the display portion 9307 is exposed by sliding the display portion 9307 and the angle of the screen is adjusted while the hinge unit which connects the top housing 9301 and the bottom housing 9302 is kept closed. In this case, the hinge unit is not opened and display is not performed on the display portion 9303. In addition, start up of only a circuit for displaying television broadcast is performed. Therefore, power can be consumed to the minimum, which is useful for the portable computer whose battery capacity is limited.

Example 1

In this example, described will be variation in electric characteristics of the single-gate thin film transistor illustrated in FIG. 1A and the dual-gate transistor illustrated in FIG. 2.

First, a manufacturing process of the thin film transistor will be described with reference to FIGS. 5A to 5C and FIGS. 6A to 6D.

A base insulating layer (not illustrated here) was formed over a substrate 101, and a gate electrode 103 was formed over the base insulating layer.

Here, a glass substrate (EAGLE XG manufactured by Corning Incorporated) was used as the substrate 101.

A titanium layer with a thickness of 50 nm was formed over the base insulating layer by sputtering a titanium target with use of argon ions at a flow rate of 20 sccm. Then, an aluminum layer with a thickness of 100 nm was formed thereover by sputtering an aluminum target with use of argon ions at a flow rate of 50 sccm. Then, a titanium layer with a thickness of 50 nm was formed thereover by sputtering a titanium target with use of argon ions at a flow rate of 20 sccm. Next, after the titanium layer was coated with a resist, exposure was performed using a first photomask. After that, development was performed, so that a resist mask was formed.

Next, etching was performed using the resist mask, so that the gate electrode 103 was formed. Here, with use of an inductively coupled plasma (ICP) apparatus, a first etching treatment was performed under conditions that the ICP power was 600 W, the bias power was 250 W, the pressure was 1.2 Pa, and an etching gas included boron trichloride at a flow rate of 60 sccm and chlorine at a flow rate of 20 sccm. Then, a second etching treatment was performed under conditions that the ICP power was 500 W, the bias power was 50 W, the pressure was 2.0 Pa, and an etching gas included carbon fluoride at a flow rate of 80 sccm.

After that, the resist mask was removed.

Next, a gate insulating layer 105 and a microcrystalline semiconductor layer 107 were formed over the gate electrode 103 and the base insulating layer. The steps up to this point are illustrated in FIG. 5A.

Here, as the gate insulating layer 105, a silicon nitride layer with a thickness of 110 nm and a silicon oxynitride layer with a thickness of 110 nm were formed.

The silicon nitride layer was formed by a plasma CVD method in which plasma discharge was performed using an RF power source frequency of 13.56 MHz and power of an RF power source of 370 W, under the deposition conditions as follows: silane, hydrogen, nitrogen, and ammonia were introduced as source gases at the flow rates of 40 sccm, 500 sccm, 550 sccm, and 140 sccm, respectively, and were stabilized; the pressure of a treatment chamber was set to 100 Pa; and the substrate temperature was set to 280° C.

The silicon oxynitride layer was formed by a plasma CVD method in which plasma discharge was performed using an RF power source frequency of 13.56 MHz and power of an RF power source of 30 W, under the deposition conditions as follows: silane and nitrous oxide were introduced as source gases at the flow rates of 5 sccm and 600 sccm, respectively, and were stabilized; the pressure of a treatment chamber was set to 25 Pa; and the substrate temperature was set to 280° C.

Next, after the substrate was taken out from the treatment chamber, the inside of the treatment chamber was cleaned, and an amorphous silicon layer was deposited as a protective layer in the treatment chamber. Then, the substrate was transferred into the treatment chamber, and the microcrystalline semiconductor layer 107 was formed.

The microcrystalline semiconductor layer 107 was formed by a plasma CVD method in which plasma discharge was performed using an RF power source frequency of 13.56 MHz and power of an RF power source of 50 W, under the deposition conditions as follows: silane, hydrogen, and argon were introduced as source gases at the flow rates of 10 sccm, 1500 sccm, and 1500 sccm, respectively, and were stabilized; the pressure of a treatment chamber was set to 280 Pa; and the substrate temperature was set to 280° C.

Here, in the Sample 1, as the microcrystalline semiconductor layer 107, a microcrystalline silicon layer with a thickness of 50 nm was formed. In the Sample 2, as the microcrystalline semiconductor layer 107, a microcrystalline silicon layer with a thickness of 70 nm was formed. In the Sample 3, as the microcrystalline semiconductor layer 107, a microcrystalline silicon layer with a thickness of 90 nm was formed.

Next, a semiconductor layer 111 was formed over the microcrystalline semiconductor layer 107, and an impurity semiconductor layer 113 was formed over the semiconductor layer 111.

The semiconductor layer 111 was formed by a plasma CVD method in which plasma discharge was performed using an RF power source frequency of 13.56 MHz and power of an RF power source of 100 W, under the deposition conditions as follows: silane, 1000 ppm ammonia (diluted with hydrogen), hydrogen, and argon were introduced as source gases at the flow rates of 40 sccm, 125 sccm, 1375 sccm, and 2000 sccm, respectively, and were stabilized; the pressure of a treatment chamber was set to 280 Pa; and the substrate temperature was set to 280° C.

Here, in the Sample 1, as the semiconductor layer 111, a silicon layer with a thickness of 100 nm was formed. In the Sample 2, as the semiconductor layer 111, a silicon layer with a thickness of 80 nm was formed. In the Sample 3, as the semiconductor layer 111, a silicon layer with a thickness of 60 nm was formed.

As the impurity semiconductor layer 113, an amorphous silicon layer to which phosphorus was added was formed to a thickness of 50 nm. The impurity semiconductor layer 113 was formed by a plasma CVD method in which plasma discharge was performed using an RF power source frequency of 13.56 MHz and power of an RF power source of 60 W, under the deposition conditions as follows: the flow rates of silane and 0.5% phosphine (diluted with hydrogen) were 100 sccm and 170 sccm, respectively; the deposition temperature was set to 280° C.; and the pressure was set to 170 Pa.

Next, as described in FIG. 5B, the impurity semiconductor layer 113 was coated with a resist, and exposure to light using a second photomask and development were performed, so that a resist mask 115 was formed.

With use of the resist mask, the microcrystalline semiconductor layer 107, the semiconductor layer 111, and the impurity semiconductor layer 113 were etched, so that a semiconductor layer 117 including a microcrystalline semiconductor region 117a and an amorphous semiconductor region 117b and an impurity semiconductor layer 121 were formed.

Figure 5C:
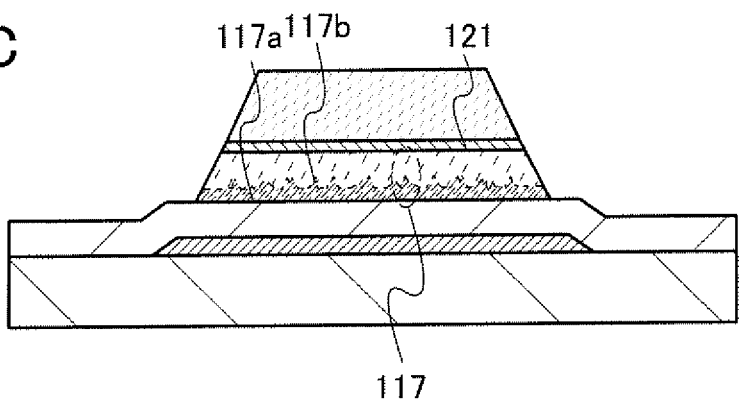

Here, an ICP apparatus was used, and the etching was performed with conditions as follows: the source power was set to 1000 W, the bias power was set to 80 W, the pressure was set to 1.51 Pa, and chlorine was used as an etching gas at a flow rate of 100 sccm (see FIG. 5C). After that, the resist mask was removed.

Next, as illustrated in FIG. 6A, a conductive layer 127 was formed to cover the gate insulating layer 105, the semiconductor layer 117, and the impurity semiconductor layer 121. Here, a titanium layer with a thickness of 50 nm was formed by sputtering a titanium target with use of argon ions at a flow rate of 20 sccm, and an aluminum layer with a thickness of 200 nm was formed thereover by sputtering an aluminum target with use of argon ions at a flow rate of 50 sccm. Then, a titanium layer with a thickness of 50 nm was formed thereover by sputtering a titanium target with use of argon ions at a flow rate of 20 sccm.

Next, after the conductive layer 127 was coated with a resist, exposure was performed using a third photomask. After that, development was performed, so that a resist mask was formed. With use of the resist mask, dry etching was performed. In this etching, the conductive layer 127 was etched, so that wirings 129a and 129b were formed (see FIG. 6B). Then, the impurity semiconductor layer 121 was dry etched so that a pair of the impurity semiconductor layers 131a and 131b which function as a source region and a drain region was formed. Further, the semiconductor layer 117 was partly etched so that a semiconductor layer 133 including the microcrystalline semiconductor region 133a and a pair of amorphous semiconductor regions 133b was formed.

Here, the etching was performed under the following conditions: the ICP power was 450 W, the bias power was 100 W, the pressure was 1.9 Pa, and the etching gases included boron chloride with a flow rate of 60 sccm and chlorine with a flow rate of 20 sccm.

In Sample 1, the semiconductor layer 133 was etched to have a depression portion whose height was 125 nm to 145 nm. As a result, the thickness of the region in the semiconductor layer 133 which does not overlap with the wiring 129a or 129b became 5 nm to 25 nm. In Sample 2, the semiconductor layer 133 was etched to have a depression portion whose height was 105 nm to 125 nm. As a result, the thickness of the region in the semiconductor layer 133 which does not overlap with the wiring 129a or 129b became 25 nm to 45 nm. In Sample 3, the semiconductor layer 133 was etched to have a depression portion whose height was 85 nm to 105 nm. As a result, the thickness of the region in the semiconductor layer 133 which does not overlap with the wiring 129a or 129b became 45 nm to 65 nm. Note that in this example, the planar shape of the wirings 129a and 129b functioning as the source electrode and drain electrode was linear.

Next, the surface of the semiconductor layer 133 was irradiated with carbon fluoride plasma, so that an impurity remaining on the surface of the semiconductor layer 133 was removed. Here, the etching conditions were as follows: the source power was set to 1000 W; the bias power was set to 0 W; the pressure was set to 0.67 Pa; and the etching gas was carbon fluoride at a flow rate of 100 sccm.

Next, the surface of the semiconductor layer 133 was irradiated with water plasma, so that surface defect of the semiconductor layer 133 was reduced and the insulation properties of the source and drain region were improved. Here, the semiconductor layer 133 was irradiated with plasma which was generated by introducing water vapor with a flow rate of 300 sccm, the source power of 1800 W, and the pressure of 66.5 Pa.

Figure 6C:
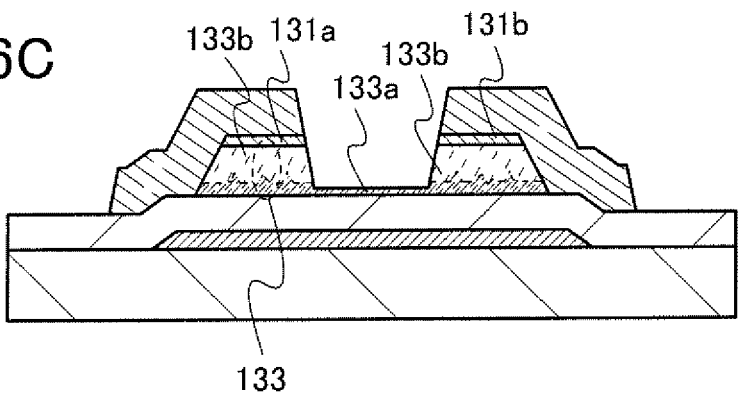
Figure 6D:
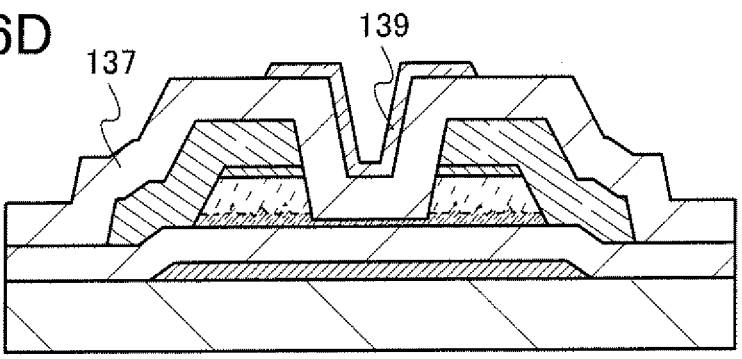

After that, the resist mask was removed. The steps up to this point are illustrated in FIG. 6C.

Through the above steps a single-gate thin film transistor illustrated in FIG. 1A was manufactured.

Next, a silicon nitride layer was formed as an insulating layer 137. As the deposition conditions at this time, silane, ammonia, nitrogen, and hydrogen were introduced as source gases at flow rates of 20 sccm, 220 sccm, 450 sccm, and 450 sccm, respectively, the pressure in the treatment chamber was 160 Pa, the substrate temperature was 250° C., and plasma discharge was performed at an output of 200 W, whereby the silicon nitride layer with a thickness of 300 nm was formed.

Next, after the insulating layer 137 was coated with a resist, exposure and development was performed using a fourth photomask, so that a resist mask was formed. With use of the resist mask, the insulating layer was partly etched with a dry etching method, so that the wirings 129a and 129b functioning as the source and drain electrodes was exposed. In addition, part of the insulating layer 137 and part of the gate insulating layer 105 were etched with a dry etching method, so that the gate electrode 103 was exposed. After that, the resist mask was removed.

Next, after a conductive layer was formed over the insulating layer 137, the conductive layer was coated with a resist, and then exposure and development was performed using a fifth photomask, so that a resist mask was formed. With use of the resist mask, the conductive layer is partly wet-etched, so that a back-gate electrode 139 was formed.

Here, as the conductive layer, a 50-nm-thick indium tin oxide containing silicon oxide was formed by a sputtering method, and then the back-gate electrode 139 was formed by wet etching treatment. Although not illustrated, the back-gate electrode 139 was connected to the gate electrode 303.

After that, the resist mask was removed. Through the above steps, the dual-gate thin film transistor illustrated in FIG. 2 was manufactured (see FIG. 6D).

Figure 17A:
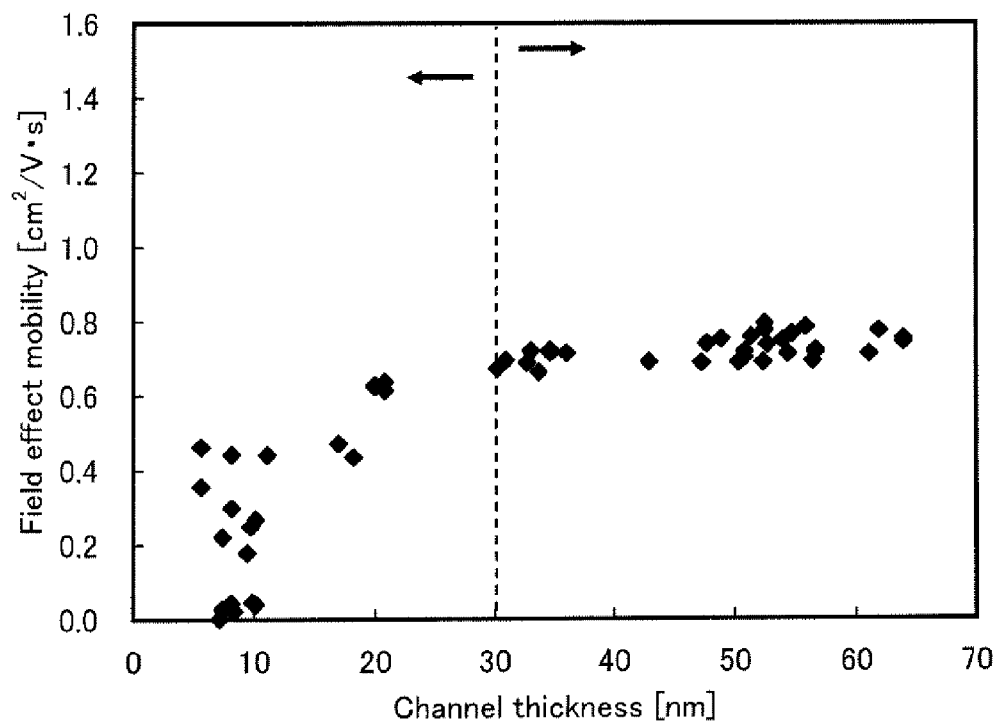
FIGS. 17A and 17B are a graph illustrating field effect mobility of a thin film transistor.
Figure 17B:
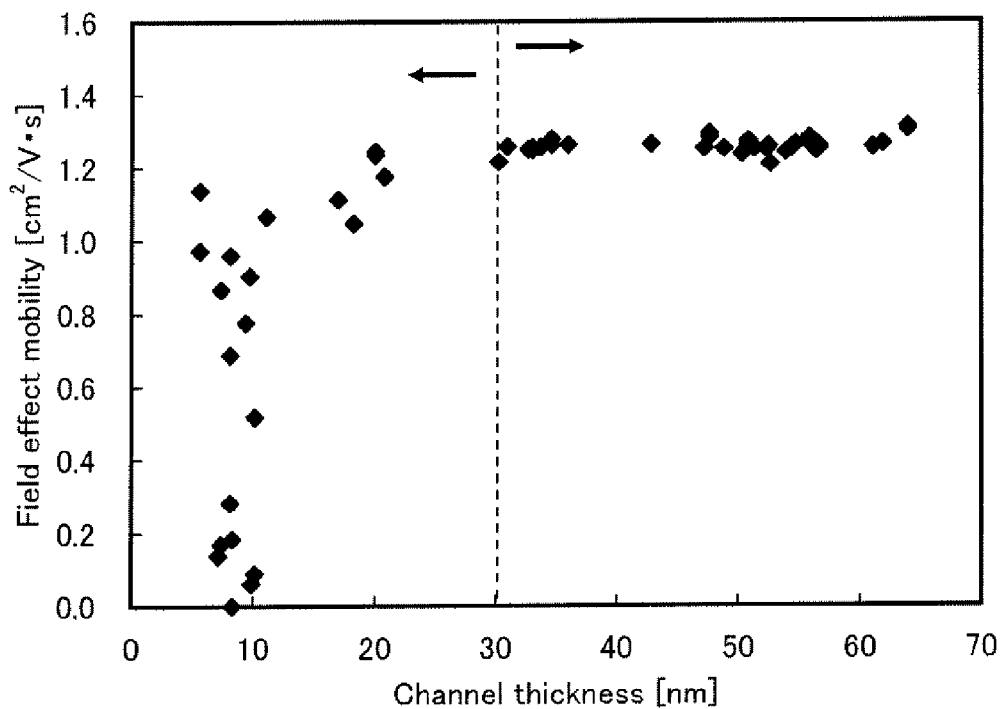

In FIG. 17A, measurement results of field effect mobility of the single-gate thin film transistors of the Samples 1 to 3 are shown. In FIG. 17B, measurement results of field effect mobility of the dual-gate thin film transistors of the Samples 1 to 3 are shown. The horizontal axis indicates a thickness of the microcrystalline semiconductor region 133a which is directly in contact with the insulating layer 137 (this is also referred to as a channel thickness) in the thin film transistors formed in the Samples 1 to 3. The vertical axis indicates field effect mobility thereof when the drain voltage is 10 V. Note that the filed-effect mobility was calculated under the condition that the single-gate thin film transistors of this example has a channel length of 3.6 μm, a channel width of 19.6 μm, a thickness of the gate insulating layer of 220 nm, and an average permittivity of 5.17.

As shown in FIGS. 17A and 17B, regardless of presence or absence of a back-gate, while variation of the field effect mobility is large when the thickness of the microcrystalline semiconductor region 133a which is directly in contact with the insulating layer 137 is smaller than 30 nm as in the Sample 1, variation of the field effect mobility is small when the thickness of the microcrystalline semiconductor region 133a which is directly in contact with the insulating layer 137 is greater than or equal to 30 nm as in the Samples 2 and 3.

In the case where the thickness of the microcrystalline semiconductor region 133a which is directly in contact with the insulating layer 137 is greater than or equal to 30 nm as in the Samples 2 and 3, field effect mobility of the dual-gate thin film transistors is higher as compared to that of the single-gate thin film transistors.

Thus, by setting the thickness of the microcrystalline semiconductor region 133a which is directly in contact with the insulating layer 137 to be greater than or equal to 30 nm as in the Samples 2 and 3, variation of the field effect mobility can be reduced and the field effect mobility can be increased. In addition, by employing a dual-gate structure, variation of the field effect mobility can be reduced and the field effect mobility can be further increased. Accordingly, by using the thin film transistors as a switching element, a display device with high contrast and high image quality can be manufactured. In addition, since the area of the thin film transistors can be reduced, by manufacturing a driving circuit using the thin film transistors, the display device can be narrowed.

This application is based on Japanese Patent Application serial no. 2009-289868 with Japan Patent Office on Dec. 21, 2009, the entire contents of which are hereby incorporated by reference.

What is claimed is:

1. A semiconductor device having a thin film transistor, the thin film transistor comprising:
    a gate electrode;
    a gate insulating layer over the gate electrode;
    a microcrystalline semiconductor region over and in contact with the gate insulating layer;
    a pair of amorphous semiconductor regions over and in contact with part of the microcrystalline semiconductor region;
    a pair of impurity semiconductor layers over the pair of amorphous semiconductor regions; and
    a pair of wirings over and in contact with the pair of impurity semiconductor layers,
    wherein the microcrystalline semiconductor region includes a first region which is not covered with the pair of amorphous semiconductor regions and a second region which is in contact with the pair of amorphous semiconductor regions,
    wherein an upper surface of the second region has a projection and a depression and flatness of the first region is higher than flatness of the second region, and
    wherein a thickness d1 of the first region is smaller than a thickness d2 of the second region and the thickness d1 is greater than or equal to 30 nm, where d2 is a distance between an upper surface of the gate insulating layer and a tip of the projection.

2. The semiconductor device according to claim 1,
    wherein the pair of amorphous semiconductor regions contain nitrogen, and
    wherein a maximum concentration of nitrogen estimated by a secondary ion mass spectrometry is from $1\times10^{20}$ atoms/cm$^3$ to $1\times10^{21}$ atoms/cm$^3$ inclusive.

3. The semiconductor device according to claim 1,
    wherein entire region of the microcrystalline semiconductor region overlaps with the gate electrode.

4. The semiconductor device according to claim 1,
    wherein the projection has a shape whose width is narrowed from the gate insulating layer toward the pair of amorphous semiconductor regions.

5. The semiconductor device according to claim 1,
    wherein the microcrystalline semiconductor region has a crystal grain whose grains size is from 2 nm to 200 nm.

6. An electronic device comprising the semiconductor device according to claim 1.

7. The electronic device according to claim 6,
    wherein the electronic device is selected from an electronic book reader, a television, a computer, a camera, a mobile phone, a portable game console, a portable information terminal, and an audio reproducing device.

8. A semiconductor device having a thin film transistor, the thin film transistor comprising:
    a gate electrode;
    a gate insulating layer over the gate electrode;
    a microcrystalline semiconductor region over and in contact with the gate insulating layer;
    a pair of amorphous semiconductor regions over and in contact with part of the microcrystalline semiconductor region;
    a pair of impurity semiconductor layers over the pair of amorphous semiconductor regions;
    a pair of wirings over and in contact with the pair of impurity semiconductor layers;
    an insulating layer over the pair of wirings; and
    an electrode over the insulating layer, the electrode overlapping with the gate electrode,
    wherein the microcrystalline semiconductor region includes a first region which is not covered with the pair of amorphous semiconductor regions and a second region which is in contact with the pair of amorphous semiconductor regions,
    wherein an upper surface of the second region has a projection and a depression and flatness of the first region is higher than flatness of the second region, and
    wherein a thickness d1 of the first region is smaller than a thickness d2 of the second region and the thickness d1 is greater than or equal to 30 nm, where d2 is a distance between an upper surface of the gate insulating layer and a tip of the projection.

9. The semiconductor device according to claim 8,
    wherein the pair of amorphous semiconductor regions contain nitrogen, and
    wherein a maximum concentration of nitrogen estimated by a secondary ion mass spectrometry is from $1\times10^{20}$ atoms/cm$^3$ to $1\times10^{21}$ atoms/cm$^3$ inclusive.

10. The semiconductor device according to claim 8,
    wherein entire region of the microcrystalline semiconductor region overlaps with the gate electrode.

11. The semiconductor device according to claim 8,
    wherein the projection has a shape whose width is narrowed from the gate insulating layer toward the pair of amorphous semiconductor regions.

12. The semiconductor device according to claim 8,
    wherein the microcrystalline semiconductor region has a crystal grain whose grains size is from 2 nm to 200 nm.

13. The semiconductor device according to claim 8,
    wherein the gate electrode is electrically connected with the electrode.

14. An electronic device comprising the semiconductor device according to claim 8.

15. The electronic device according to claim 14,
    wherein the electronic device is selected from an electronic book reader, a television, a computer, a camera, a mobile phone, a portable game console, a portable information terminal, and an audio reproducing device.

\* \* \* \* \*